(12) United States Patent
Ma et al.

(10) Patent No.: US 11,295,645 B2
(45) Date of Patent: Apr. 5, 2022

(54) SHIFT REGISTER AND DRIVING METHOD THEREOF, GATE DRIVING CIRCUIT AND DISPLAY APPARATUS

(71) Applicants: BOE TECHNOLOGY GROUP CO., LTD., Beijing (CN); ORDOS YUANSHENG OPTOELECTRONICS CO., LTD., Inner Mongolia (CN)

(72) Inventors: Mingchao Ma, Beijing (CN); Jun Fan, Beijing (CN)

(73) Assignees: BOE TECHNOLOGY GROUP CO., LTD., Beijing (CN); ORDOS YUANSHENG OPTOELECTRONICS CO., LTD., Inner Mongolia (CN)

( * ) Notice: Subject to any disclaimer, the term of this patent is extended or adjusted under 35 U.S.C. 154(b) by 932 days.

(21) Appl. No.: 16/068,278

(22) PCT Filed: Dec. 13, 2017

(86) PCT No.: PCT/CN2017/115959
§ 371 (c)(1),
(2) Date: Jul. 5, 2018

(87) PCT Pub. No.: WO2018/209937
PCT Pub. Date: Nov. 22, 2018

(65) Prior Publication Data
US 2021/0193000 A1 Jun. 24, 2021

(30) Foreign Application Priority Data

May 16, 2017 (CN) .......................... 201710344494.9

(51) Int. Cl.
*G09G 3/20* (2006.01)
*G06F 3/041* (2006.01)
*G11C 19/28* (2006.01)

(52) U.S. Cl.
CPC .............. *G09G 3/20* (2013.01); *G06F 3/0412* (2013.01); *G06F 3/04166* (2019.05);
(Continued)

(58) Field of Classification Search
CPC ............. G09G 3/20; G09G 2300/0426; G09G 2300/08; G09G 2310/0267;
(Continued)

(56) References Cited

U.S. PATENT DOCUMENTS 9,208,737 B2 * 12/2015 Hong .................. G09G 3/3674
2002/0075729 A1 6/2002 Choi
(Continued)

FOREIGN PATENT DOCUMENTS

CN 105118417 A 12/2015
CN 106128347 A 11/2016
(Continued)

OTHER PUBLICATIONS

International Search Report and Written Opinion dated Mar. 12, 2018; PCT/CN2017/115959.

*Primary Examiner* — Sejoon Ahn

(57) ABSTRACT

A shift register and a driving method thereof, a gate driving circuit and a display apparatus are disclosed. The shift register includes an input circuit, a pull-up node charging circuit and an output circuit. The pull-up node charging circuit is connected with a first voltage terminal, a second voltage terminal, the input circuit and a pull-up node, and is configured to charge the pull-up node and maintain a level of the pull-up node under control of the first input signal.

18 Claims, 12 Drawing Sheets

(52) U.S. Cl.
CPC ..... *G11C 19/28* (2013.01); *G09G 2300/0426* (2013.01); *G09G 2300/08* (2013.01); *G09G 2310/0267* (2013.01); *G09G 2310/0283* (2013.01); *G09G 2310/0286* (2013.01); *G09G 2310/08* (2013.01); *G09G 2330/08* (2013.01)

(58) Field of Classification Search
CPC ... G09G 2310/0283; G09G 2310/0286; G09G 2310/08; G09G 2330/08; G06F 3/04155; G06F 3/0412; G11C 19/28
See application file for complete search history.

(56) References Cited

U.S. PATENT DOCUMENTS

| | | | |
|---|---|---|---|
| 2010/0177082 A1 | 7/2010 | Joo et al. | |
| 2010/0245298 A1* | 9/2010 | Chen | G09G 3/3677 345/204 |
| 2014/0169518 A1* | 6/2014 | Kong | G09G 3/3674 377/64 |
| 2017/0092172 A1 | 3/2017 | Wang | |
| 2018/0040299 A1* | 2/2018 | Zhao | G09G 3/3266 |

FOREIGN PATENT DOCUMENTS

| | | |
|---|---|---|
| CN | 106486049 A | 3/2017 |
| CN | 106940977 A | 7/2017 |

\* cited by examiner

SHIFT REGISTER AND DRIVING METHOD THEREOF, GATE DRIVING CIRCUIT AND DISPLAY APPARATUS

The present application claims the priority of Chinese patent application No. 201710344494.9 filed on May 16, 2017, and the entire content disclosed by the Chinese patent application is incorporated herein by reference as part of the present application.

TECHNICAL FIELD

Embodiments of the present disclosure relate to a shift register and a driving method thereof, a gate driving circuit and a display apparatus.

BACKGROUND

In the field of display technology, for example, the pixel array of a liquid crystal display generally includes rows of gate lines and columns of data lines that intersect with each other. Driving of the gate lines can be implemented by an integrated driving circuit chip amounted on an array substrate. In recent years, with the continuous improvement of an amorphous silicon thin film process, a gate driving circuit can also be directly fabricated on a thin film transistor array substrate to form a GOA (Gate driver On Array) to drive gate lines.

For example, the GOA formed of a plurality of cascaded shift registers can be used to provide switching voltage signals for the rows of gate lines of a pixel array, thereby controlling the rows of gate lines to be turned on sequentially. Data signals are provided by data lines to the pixel units of a corresponding row in the pixel array in each period, thereby forming gray voltages required for displaying grayscales of an image, and displaying each frame of the image.

SUMMARY

At least one embodiment of the present disclosure provides a shift register, comprising an input circuit, a pull-up node charging circuit and an output circuit. The input circuit is connected with a first input terminal, a first control terminal and the pull-up node charging circuit, and is configured to output a first input signal provided by the first input terminal in response to a first control signal provided by the first control terminal; the pull-up node charging circuit is connected with a first voltage terminal, a second voltage terminal, the input circuit and a pull-up node, and is configured to charge the pull-up node and maintain a level of the pull-up node under control of the first input signal; and the output circuit is connected with the pull-up node, a first clock signal terminal and an output terminal, and is configured to output a first clock signal provided by the first clock signal terminal to the output terminal under control of the level of the pull-up node.

For example, a shift register provided by an embodiment of the present disclosure further comprises a pull-down node control circuit, an output reset circuit and a pull-up node reset circuit. The pull-down node control circuit is connected with a second clock signal terminal, the second voltage terminal, a pull-down node, the input circuit and the pull-up node charging circuit, and is configured to control a level of the pull-down node in response to a second clock signal provided by the second clock signal terminal or the first input signal; the pull-up node reset circuit is connected with the pull-down node, the second voltage terminal and the pull-up node charging circuit, and is configured to pull down and reset the pull-up node under control of the level of the pull-down node; and the output reset circuit is connected with the output terminal, the pull-down node and the second voltage terminal, and is configured to reset and denoise the output terminal under control of the level of the pull-down node.

For example, in a shift register provided by an embodiment of the present disclosure, the pull-down node control circuit comprises a first pull-down node charging circuit and a first pull-down node reset circuit, the first pull-down node charging circuit is connected with the second clock signal terminal, the second voltage terminal and the pull-down node, and is configured to charge the pull-down node in response to the second clock signal provided by the second clock signal terminal; and the first pull-down node reset circuit is connected with the second voltage terminal, the pull-down node, the input circuit and the pull-up node charging circuit, and is configured to pull down and reset the pull-down node in response to the first input signal.

For example, a shift register provided by an embodiment of the present disclosure further comprises a second pull-down node reset circuit. The second pull-down node reset circuit is connected with the pull-down node, the output terminal and the second voltage terminal, and is configured to pull down and reset the pull-down node under control of a level of the output terminal.

For example, a shift register provided by an embodiment of the present disclosure further comprises a second pull-down node charging circuit. The second pull-down node charging circuit is connected with the pull-down node and a reset terminal, and is configured to charge the pull-down node in response to a reset signal provided by the reset terminal.

For example, a shift register provided by an embodiment of the present disclosure further comprises a touch reset circuit. The touch reset circuit is connected with the output terminal, the second voltage terminal and a touch enable terminal, and is configured to reset and denoise the output terminal in response to a touch enable signal provided by the touch enable terminal.

For example, in a shift register provided by an embodiment of the present disclosure, the input circuit comprises a first transistor. A gate electrode of the first transistor is configured to be connected with the first control terminal to receive the first control signal, a first electrode of the first transistor is configured to be connected with the first input terminal to receive the first input signal, and a second electrode of the first transistor is connected with the pull-up node charging circuit.

For example, in a shift register provided by an embodiment of the present disclosure, the input circuit further comprises a second transistor. A gate electrode of the second transistor is configured to be connected with a second control terminal to receive a second control signal, a first electrode of the second transistor is connected with the pull-up node charging circuit, and a second electrode of the second transistor is configured to be connected with a second input terminal to receive a second input signal. The first transistor and the second transistor are not turned on simultaneously.

For example, in a shift register provided by an embodiment of the present disclosure, the output circuit comprises a third transistor and a first storage capacitance. A gate electrode of the third transistor is connected with the pull-up node, a first electrode of the third transistor is configured to be connected with the first clock signal terminal to receive the first clock signal, and a second electrode of the third transistor is connected with the output terminal. A first electrode of the first storage capacitance is connected with the pull-up node, and a second electrode of the first storage capacitance is connected with the output terminal.

For example, in a shift register provided by an embodiment of the present disclosure, the pull-up node charging circuit comprises a fourth transistor, a fifth transistor and a second storage capacitance. A gate electrode of the fourth transistor is connected with the input circuit, a first electrode of the fourth transistor is connected with a first voltage terminal, and a second electrode of the fourth transistor is connected with a pull-up control node. A gate electrode of the fifth transistor is connected with the first voltage terminal, a first electrode of the fifth transistor is connected with the pull-up control node, and a second electrode of the fifth transistor is connected with the pull-up node. A first electrode of the second storage capacitance is connected with the pull-up control node, and a second electrode of the second storage capacitance is connected with the second voltage terminal.

For example, in a shift register provided by an embodiment of the present disclosure, the first pull-down node reset circuit comprises a sixth transistor. A gate electrode of the sixth transistor is connected with both the input circuit and the pull-up node charging circuit, a first electrode of the sixth transistor is connected with the pull-down node, and a second electrode of the sixth transistor is connected with the second voltage terminal.

For example, in a shift register provided by an embodiment of the present disclosure, the first pull-down node charging circuit comprises a seventh transistor and a third storage capacitance. A gate electrode and a first electrode of the seventh transistor are configured to be connected with the second clock signal terminal to receive the second clock signal, and a second electrode of the seventh transistor is connected with the pull-down node. A first electrode of the third storage capacitance is connected with the pull-down node, and a second electrode of the third storage capacitance is connected with the second voltage terminal.

For example, in a shift register provided by an embodiment of the present disclosure, the pull-up node reset circuit comprises an eighth transistor. A gate electrode of the eighth transistor is connected with the pull-down node, a first electrode of the eighth transistor is connected with a pull-up control node, and a second electrode of the eighth transistor is connected with the second voltage terminal.

For example, in a shift register provided by an embodiment of the present disclosure, the output reset circuit comprises a ninth transistor. A gate electrode of the ninth transistor is connected with the pull-down node, a first electrode of the ninth transistor is connected with the output terminal, and a second electrode of the ninth transistor is connected with the second voltage terminal.

For example, in a shift register provided by an embodiment of the present disclosure, the second pull-down node reset circuit comprises a tenth transistor. A gate electrode of the tenth transistor is connected with the output terminal, a first electrode of the tenth transistor is connected with the pull-down node, and a second electrode of the tenth transistor is connected with the second voltage terminal.

For example, in a shift register provided by an embodiment of the present disclosure, the second pull-down node charging circuit comprises an eleventh transistor. A gate electrode and a first electrode of the eleventh transistor are configured to be connected with the reset terminal to receive the reset signal, and a second electrode of the eleventh transistor is connected with the pull-down node;

For example, in a shift register provided by an embodiment of the present disclosure, the touch reset circuit comprises a twelfth transistor. A gate electrode of the twelfth transistor is configured to be connected with the touch enable terminal to receive the touch enable signal, a first electrode of the twelfth transistor is connected with the output terminal, and a second electrode of the twelfth transistor is connected with the second voltage terminal.

At least one embodiment of the present disclosure further provides a gate driving circuit, comprising a plurality of cascaded shift registers each of which is provided by the embodiments of the present disclosure. Except a first-stage shift register, a first input terminal of any one of the shift registers of other stages is connected with an output terminal of a shift register of the preceding stage.

At least one embodiment of the present disclosure further provides a gate driving circuit, comprising a plurality of cascaded shift registers each of which is provided by the embodiments of the present disclosure. Except a first-stage shift register, a first input terminal of any one of the shift registers of the other stages is connected with an output terminal of a shift register of the preceding stage; and except a last-stage shift register, a second input terminal of any one of the shift registers of the other stages is connected with an output terminal of a shift register of the next stage.

At least one embodiment of the present disclosure further provides a display apparatus, comprising the gate driving circuit provided by the embodiment of the present disclosure.

At least one embodiment of the present disclosure further provides a driving method of the shift register, comprising: in a first stage, by the input circuit, outputting the first input signal in response to the first control signal, and by the pull-up node charging circuit, charging the pull-up node under control of the first input signal; and in a second stage, by the pull-up node charging circuit, maintaining the level of the pull-up node, and by the output circuit, outputting the first clock signal to the output terminal under control of the level of the pull-up node.

At least one embodiment of the present disclosure further provides a driving method of the shift register, comprising: in a first stage, by the input circuit, outputting the first input signal in response to the first control signal, by the pull-up node charging circuit, charging the pull-up node under control of the first input signal, and by the first pull-down node reset circuit, pulling down and resetting the pull-down node in response to the first input signal; in a second stage, by the pull-up node charging circuit, maintaining the level of the pull-up node, and by the output circuit, outputting the first clock signal to the output terminal under control of the level of the pull-up node; and in a third stage, by the first pull-down node charging circuit, charging the pull-down node in response to the second clock signal, by the pull-up node reset circuit, pulling down and resetting the pull-up node under control of the level of the pull-down node, and by the output reset circuit, resetting and denoising the output terminal under control of the level of the pull-down node. In the first stage, the second stage and the third stage, one of the first clock signal and the second clock signal is a high level signal, and the other is a low level signal.

At least one embodiment of the present disclosure further provides a driving method of the shift register, comprising: when the first control signal is at a first level and the second control signal is at a second level, enabling the shift register to operate in a forward scanning mode; when the first control signal is at the second level and the second control signal is at the first level, enabling the shift register to operate in a reverse scanning mode; and one of the first level and the second level is a high level and the other is a low level.

BRIEF DESCRIPTION OF DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

In the display panel technology, a GOA (Gate driver On Array) technology can be adopted in order to realize a low cost and a narrow bezel design, that is, a gate driving circuit is integrated on a display panel through a thin film transistor manufacturing process, so advantages such as a narrow bezel design and the reduction in assembly cost can be realized. For example, the display panel can be a liquid crystal display (LCD) panel or an organic light emitting diode (OLED) display panel.

Figure 1:
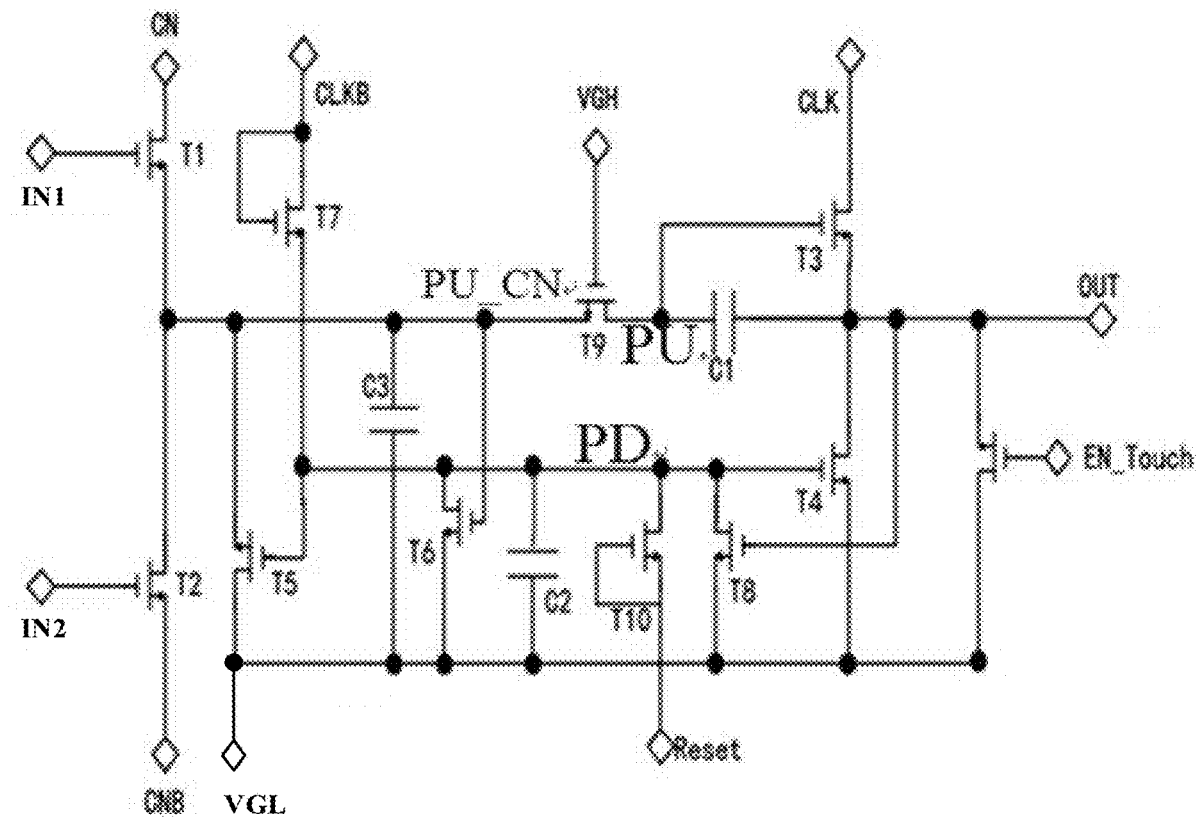
FIG. 1 is a schematic circuit diagram of a shift register.

FIG. 1 shows a schematic circuit diagram of a shift register, and the shift register can be cascaded to form a gate driving circuit. As shown in FIG. 1, the shift register adopts a structure of 11T3C, that is, the shift register includes eleven transistors (T1-T11) and three capacitors (C1, C2 and C3).

For example, if the shift registers as shown in FIG. 1 are cascaded to form a gate driving circuit, for any one stage of the shift registers, for example, a forward scanning is illustrated as an example (for example, the forward scanning is implemented when a first control terminal CN is at a high level and a second control terminal CNB is at a low level), and the high level inputted by the first control terminal CN electrically charges a pull-up node PU. Because the second control terminal CNB is at a low level, a voltage difference between a source electrode and a drain electrode of a second transistor T2 is relatively large, and the pull-up node PU can suffer from leak current through the second transistor T2, especially when the leakage current of the transistor is large under a high temperature condition, there occurs a voltage drop at the pull-up node PU, which in turn causes a voltage drop at an output of the current stage and can even result in an output that does not meet requirements. In addition, when the gate driving circuit is used for a TDDI (Touch & Display Driver Integration) product, after a touch scanning stage, because the leakage current from the pull-up node PU is large under a high temperature condition, there occurs a large voltage drop at the pull-up node PU, and the bootstrap voltage of the pull-up node PU cannot reach a higher level when the current stage outputting signals, thereby resulting in a voltage drop at the output of the current stage. As described above, if the gate driving circuit formed by the cascade of shift registers as shown in FIG. 1 is adopted to drive a display panel, the voltage drop existing at the pull-up node PU especially under a high temperature condition can cause the voltage drop at the output of the shift register, and thereby can cause problems such as poor display and poor high-temperature reliability.

At least one embodiment of the present disclosure provides a shift register including an input circuit, a pull-up node charging circuit and an output circuit. The input circuit is connected with a first input terminal, a first control terminal and the pull-up node charging circuit, and is configured to output a first input signal provided by the first input terminal in response to a first control signal provided by the first control terminal. The pull-up node charging circuit is connected with a first voltage terminal, a second voltage terminal, the input circuit and a pull-up node, and is configured to charge the pull-up node and maintain a level of the pull-up node under the control of the first input signal. The output circuit is connected with the pull-up node, a first clock signal terminal and an output terminal, and is configured to output a first clock signal provided by the first clock signal terminal to the output terminal under the control of the level of the pull-up node.

At least one embodiment of the present disclosure further provides a gate driving circuit, a display apparatus and a driving method corresponding to the above-described shift register.

The shift register and the driving method thereof, the gate driving circuit and the display apparatus provided in the embodiments of the present disclosure can better maintain the level of the pull-up node PU, and reduce or eliminate the voltage drop of the pull-up node PU, thereby enabling the output of the current stage to be kept normal and free from a voltage drop when the leakage current of a transistor is large under a high temperature condition. Furthermore, there is no output at other moments than the output of the current stage, that is, the problem of multiple outputs can be avoided. Therefore, if the shift register provided by at least one embodiment of the present disclosure is applied to a touch display product, the shift register can solve the problem of poor display and the like, and in particular, can have a significant improvement effect in high-temperature reliability.

The embodiments of the present disclosure will be described in detail below with reference to the accompanying drawings.

Figure 2:
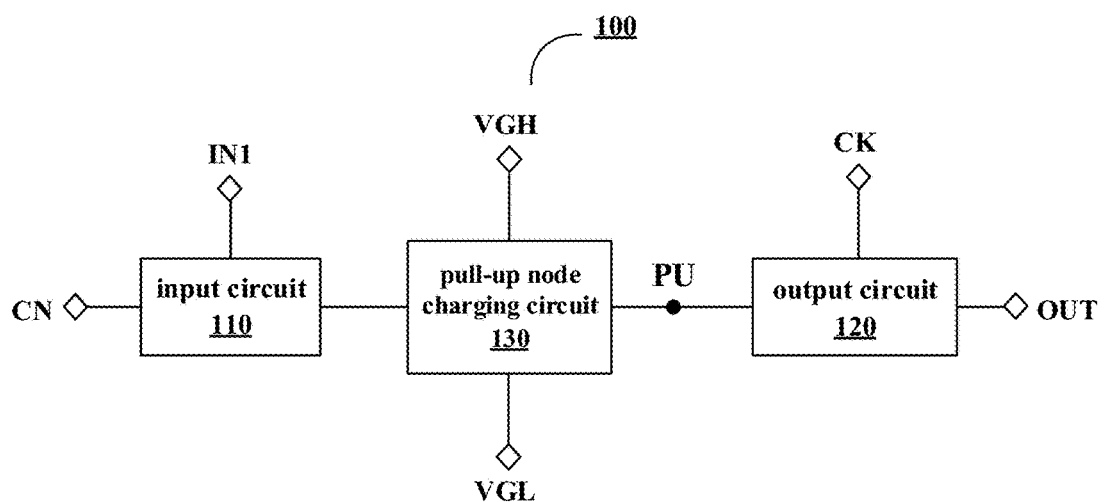
FIG. 2 is a schematic block diagram of a shift register according to an example of an embodiment of the present disclosure.

An example of an embodiment of the present disclosure provides a shift register 100, as shown in FIG. 2, the shift register 100 includes an input circuit 110, a pull-up node charging circuit 130 and an output circuit 120.

The input circuit 110 is connected with a first input terminal IN1, a first control terminal CN and the pull-up node charging circuit 130, and is configured to output a first input signal provided by the first input terminal IN1 in response to a first control signal provided by the first control terminal CN. For example, the input circuit 110 can be turned on under the control of the first control signal provided by the first control terminal CN, thereby outputting the first input signal provided by the first input terminal IN1 to the pull-up node charging circuit 130.

Figure 3:
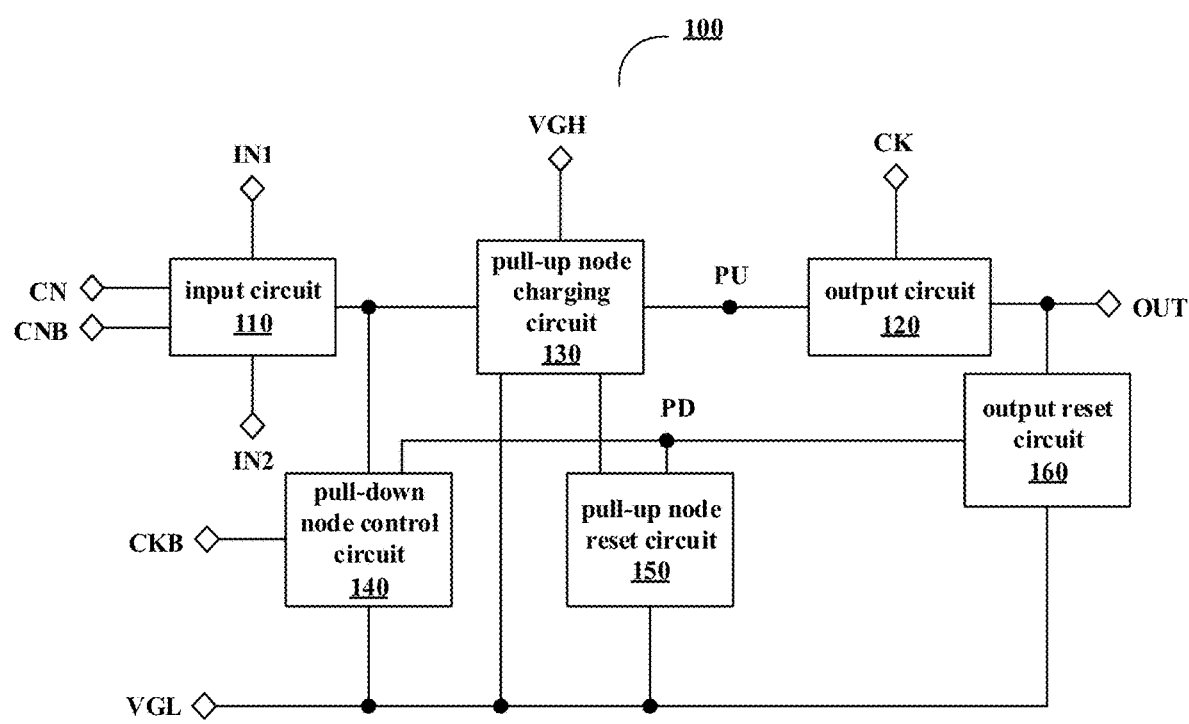
FIG. 3 is a schematic block diagram of a shift register according to another example of an embodiment of the present disclosure.
Figure 4:
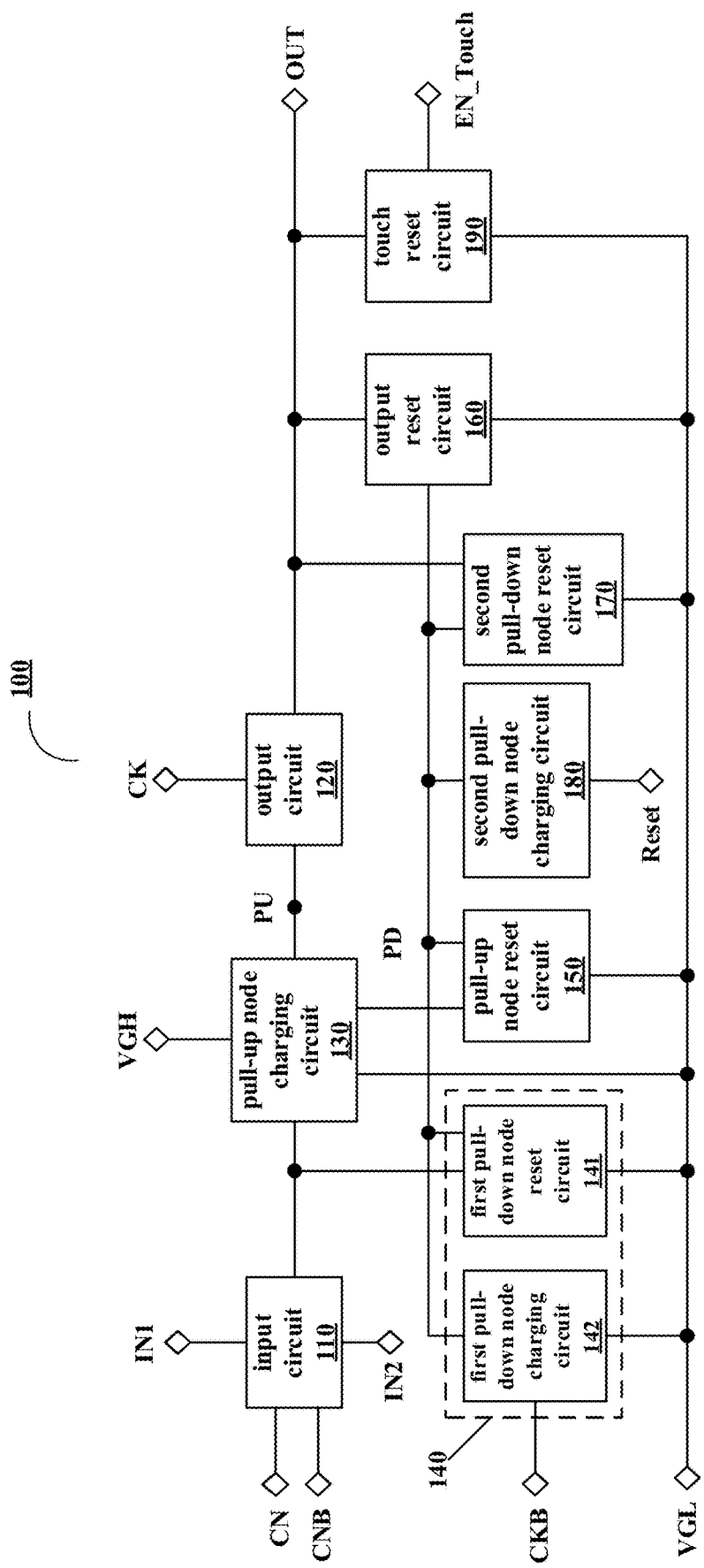
FIG. 4 is a schematic block diagram of a shift register according to another example of an embodiment of the present disclosure.

It should be noted that in some examples, as shown in FIG. 3 and FIG. 4, the input circuit 110 can also be connected with a second input terminal IN2 and a second control terminal CNB, thereby a bidirectional scanning function (that is, a forward scanning and a reverse scanning) can be implemented. For example, the input circuit 110 can be further configured to output a second input signal provided by the second input terminal IN2 in response to a second control signal provided by the second control terminal CNB. For example, the shift register 100 operates in a forward scanning mode when the first control signal is at a first level and the second control signal is at a second level; and the shift register 100 operates in a reverse scanning mode when the first control signal is at the second level and the second control signal is at the first level. One of the first level and the second level is a high level and the other is a low level. For example, the first level can be a high level, such as 3.3V-5V, while the second level is a low level, such as 0V-0.4V. The embodiments of the present disclosure include, but are not limited to, the above-described arrangement, for example, it is also possible to make the first level to be a low level, and to make the second level to be a high level. The following embodiments are the same in this aspect and will not be repeated herein.

Still with reference to FIG. 2, the pull-up node charging circuit 130 is connected with a first voltage terminal VGH, a second voltage terminal VGL, the input circuit 110 and a pull-up node PU, and is configured to electrically charge the pull-up node PU and maintain a level of the pull-up node PU under the control of the first input signal. For example, the pull-up node charging circuit 130 can enable the first voltage terminal VGH to be electrically connected with the pull-up node PU under the control of the first input signal, thereby a first voltage (for example, a high level) inputted by the first voltage terminal VGH can charge the pull-up node PU. For another example, when the shift register 100 outputting progressive scanning signals, the pull-up node charging circuit 130 can enable the level of the pull-up node PU to be maintained better under the control of the first input signal, thereby enabling an output of the current stage to be kept normal and free from a voltage drop.

The output circuit 120 is connected with the pull-up node PU, a first clock signal terminal CK and an output terminal OUT, and is configured to output a first clock signal provided by the first clock signal terminal CK to the output terminal OUT under the control of the level of the pull-up node PU. For example, the output circuit 120 can enable the first clock signal terminal CK to be electrically connected with the output terminal OUT under the control of the level of the pull-up node PU, thereby outputting the first clock signal inputted by the first clock signal terminal CK to the output terminal OUT.

For example, in another example of an embodiment of the present disclosure, as shown in FIG. 3, the shift register 100 further includes a pull-down node control circuit 140, a pull-up node reset circuit 150 and an output reset circuit 160.

The pull-down node control circuit 140 is connected with a second clock signal terminal CKB, the second voltage terminal VGL, a pull-down node PD, the input circuit 110 and the pull-up node charging circuit 130, and is configured to control a level of the pull-down node PD in response to a second clock signal provided by the second clock signal terminal CKB or the first input signal outputted by the input circuit 110.

For example, in an example, as shown in FIG. 4, the pull-down node control circuit 140 includes a first pull-down node reset circuit 141 and a first pull-down node charging circuit 142.

The first pull-down node charging circuit 142 is connected with the second clock signal terminal CKB, the second voltage terminal VGL and the pull-down node PD, and is configured to charge the pull-down node PD in response to the second clock signal provided by the second clock signal terminal CKB. For example, the first pull-down node charging circuit 142 can be turned on under the control of the second clock signal provided by the second clock signal terminal CKB, thereby enabling the second clock signal terminal CKB to be electrically connected with the pull-down node PD. For example, the second clock signal charges the pull-down PD when the second clock signal is a high level signal.

The first pull-down node reset circuit 141 is connected with the second voltage terminal VGL, the pull-down node PD, the input circuit 110 and the pull-up node charging circuit 130, and is configured to pull down and reset the pull-down node PD in response to the first input signal. For example, the first pull-down node reset circuit 141 can enable the pull-down node PD to be electrically connected with the second voltage terminal VGL under the control of the first input signal outputted by the input circuit 110. For example, the second voltage terminal VGL maintains inputting a DC low level signal, thereby pulling down and resetting the pull-down node PD.

It should be noted that, the first voltage terminals VGH in the embodiments of the present disclosure, for example, maintain inputting a DC high level signal, and the DC high level is referred to as a first voltage; and the second voltage terminal VGL, for example, maintains inputting a DC low level signal, and the DC low level is referred to as a second voltage. The following embodiments are the same in this aspect and will not be repeated herein.

Still with reference to FIG. 3, the pull-up node reset circuit 150 is connected with the pull-down node PD, the second voltage terminal VGL and the pull-up node charging circuit 130, and is configured to pull down and reset the pull-up node PU under the control of the level of the pull-down node PD. For example, the pull-up node reset circuit 150 can be turned on under the control of the level of the pull-down node PD, while the pull-up node charging circuit 130 enables the pull-up node PU to be electrically connected with the pull-up node reset circuit 150 under the control of the first voltage, thereby enabling the pull-up node PU to be electrically connected with the second voltage terminal VGL, and enabling the second voltage terminal VGL to pull down and reset the pull-up node PU.

The output reset circuit 160 is connected with the output terminal OUT, the pull-down node PD and the second voltage terminal VGL, and is configured to reset and denoise the output terminal OUT under the control of the level of the pull-down node PD. For example, the output reset circuit 160 can enable the output terminal OUT to be electrically connected with the second voltage terminal VGL under the control of the level of the pull-down node PD, thereby a low level inputted by the second voltage terminal VGL can reset and denoise the output terminal OUT.

For example, in another example of an embodiment of the present disclosure, as shown in FIG. 4, the shift register 100 further includes a second pull-down node reset circuit 170.

The second pull-down node reset circuit 170 is connected with the pull-down node PD, the output terminal OUT and the second voltage terminal VGL, and is configured to pull down and reset the pull-down node PD under the control of a level of the output terminal OUT. For example, the second pull-down node reset circuit 170 can enable the pull-down node PD to be electrically connected with the second voltage terminal VGL under the control of the level of the output terminal OUT, thereby the second voltage terminal VGL can pull down and reset the pull-down node PD. In this way, when the output terminal OUT of the shift register 100 performs a normal output, the potential of the pull-down node PD can be pulled down and reset, and the normal output of the output terminal OUT can be further guaranteed.

For example, in another example of an embodiment of the present disclosure, as shown in FIG. 4, the shift register 100 further includes a second pull-down node charging circuit 180.

The second pull-down node charging circuit 180 is connected with the pull-down node PD and a reset terminal Reset, and is configured to charge the pull-down node PD in response to a reset signal provided by the reset terminal Reset. For example, the second pull-down node charging circuit 180 can be turned on under the control of the reset signal, and enabling the reset terminal Reset to be electrically connected with the pull-down node PD. For example, the reset signal can be a high level signal, thereby the reset signal of a high level charging the pull-down node PD to increase the potential of the pull-down node PD. For example, the pull-up node reset circuit 150 and the output reset circuit 160 can be turned on under the control of the high level of the pull-down node PD, thereby further implementing a reset operation of the pull-up node PU and the output terminal OUT. For example, a plurality of cascaded shift registers 100 can be adopted to form a gate driving circuit. If the gate driving circuit is adopted to drive a display panel, reset signals can be provided to the stages of shift registers in the gate driving circuit at the same time when the display panel is powered on, so as to implement the reset operation of the pull-up nodes PU and the output terminals OUT of the stages of shift registers simultaneously, thereby implementing an initialization of the entire gate driving circuit.

For example, in another example of an embodiment of the present disclosure, as shown in FIG. 4, the shift register 100 further includes a touch reset circuit 190.

The touch reset circuit 190 is connected with the output terminal OUT, the second voltage terminal VGL and a touch enable terminal EN_Touch, and is configured to reset and denoise the output terminal OUT in response to a touch enable signal provided by the touch enable terminal EN_Touch. For example, the touch reset circuit 190 can be turned on under the control of the touch enable signal, and enabling the output terminal OUT to be electrically connected with the second voltage terminal VGL, thereby the low level signal inputted by the second voltage terminal VGL can reset and denoise the output terminal OUT. For example, a plurality of cascaded shift registers 100 can be adopted to form a gate driving circuit. If the gate driving circuit is used for a TDDI (Touch & Display Driver Integration) product, for example, the above-described touch enable signal is generated to perform the operation of resetting and denoising the output terminals OUT of the stages of shift registers when the product enters a touch scanning stage, so as to avoid poor display and interference between a display operation and a touch operation.

The shift registers provided in the embodiments of the present disclosure can better maintain the level of the pull-up node PU and reduce the voltage drop of the pull-up node PU, thereby enabling the output of the current stage to be kept normal and free from a voltage drop when the leakage current of the transistor is large under a high temperature condition. The shift register can solve the problem of poor display and the like, and in particular, it has a significant improvement effect in high-temperature reliability.

Figure 5:
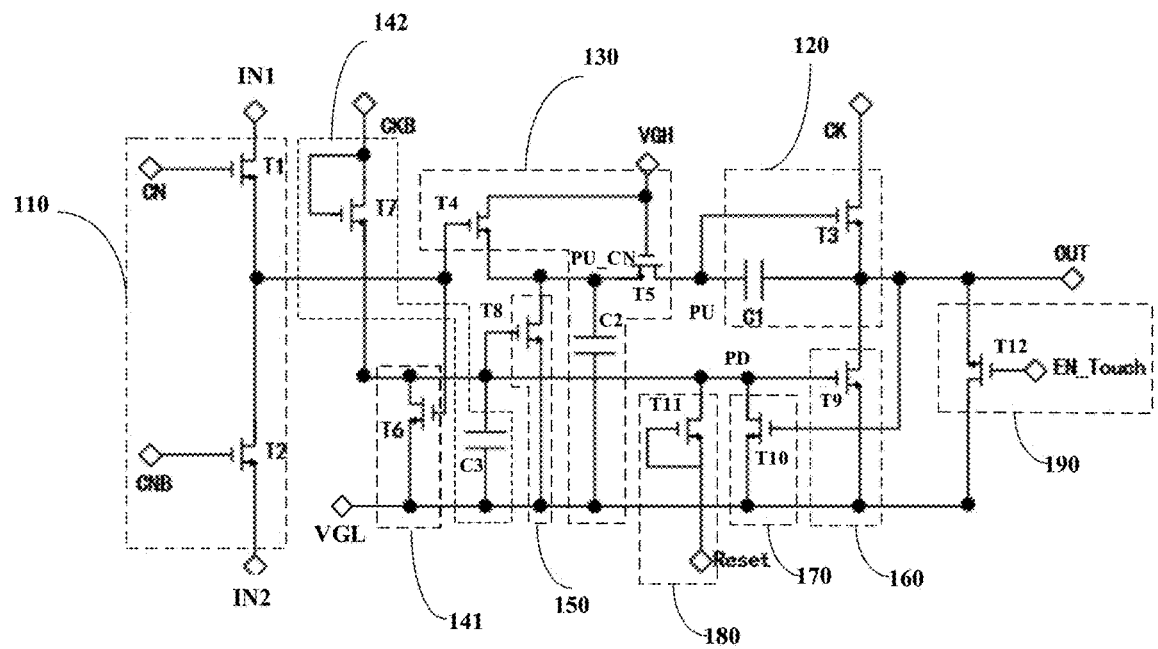
FIG. 5 is a schematic circuit diagram of an implementation example of the shift register as shown in FIG. 4.

For example, the shift register 100 as shown in FIG. 4 can be implemented in the circuit structure as shown in FIG. 5 in one example. As shown in FIG. 5, the shift register 100 includes a first transistor to a twelfth transistor T1-T12, a first storage capacitor C1, a second storage capacitor C2 and a third storage capacitor C3.

For example, as shown in FIG. 5, in this example, in more detail, the input circuit 110 can be implemented to include a first transistor T1 and a second transistor T2. A gate electrode of the first transistor T1 is configured to be connected with the first control terminal CN to receive the first control signal, a first electrode of the first transistor T1 is configured to be connected with the first input terminal IN1 to receive the first input signal, and a second electrode of the first transistor T1 is connected with the pull-up node charging circuit 130 so as to output the first input signal to the pull-up node charging circuit 130. A gate electrode of the second transistor 12 is configured to be connected with a second control terminal CNB to receive a second control signal, a second electrode of the second transistor T2 is configured to be connected with a second input terminal IN2 to receive a second input signal, and a first electrode of the second transistor T2 is connected with the pull-up node charging circuit 130 so as to output the second input signal to the pull-up node charging circuit 130.

The first transistor T1 and the second transistor T2 are not turned on simultaneously. For example, when the shift register 100 operates in the forward scanning mode, the first transistor T1 can be turned on under the control of the first control signal (the second transistor T2 is in a turn-off state at this time), thereby the first transistor T1 outputs the first input signal to the pull-up node charging circuit 130. For another example, when the shift register 100 operates in the reverse scanning mode, the second transistor T2 can be turned on under the control of the second control signal (the first transistor T1 is in a turn-off state at this time), thereby the second transistor 12 outputs the second input signal to the pull-up node charging circuit 130. The switching between the forward scanning mode and the reverse scanning mode can be achieved by the cooperation of the first control signal and the second control signal.

It should be noted that, in some embodiments, the input circuit 110 does not need to include the second transistor T2 without supporting the bidirectional scanning, which is not limited in the embodiments of the present disclosure.

The output circuit 120 can be implemented to include a third transistor T3 and a first storage capacitance C1. A gate electrode of the third transistor T3 is connected with the pull-up node PU, a first electrode of the third transistor T3 is configured to be connected with the first clock signal terminal CK to receive the first clock signal, and a second electrode of the third transistor T3 is connected with the output terminal OUT. A first electrode of the first storage capacitance C1 is connected with the pull-up node PU, and a second electrode of the first storage capacitance C1 is connected with the output terminal OUT.

The pull-up node charging circuit 130 can be implemented to include a fourth transistor T4, a fifth transistor T5 and a second storage capacitance C2. A gate electrode of the fourth transistor T4 is connected with the input circuit 110, a first electrode of the fourth transistor T4 is connected with the first voltage terminal VGH to receive the first voltage, and a second electrode of the fourth transistor T4 is connected with a pull-up control node PU_CN. A gate electrode of the fifth transistor T5 is connected with the first voltage terminal VGH to receive the first voltage so that the fifth transistor T5 remains in a turn-on state, a first electrode of the fifth transistor T5 is connected with the pull-up control node PU_CN, and a second electrode of the fifth transistor T5 is connected with the pull-up node PU. A first electrode of the second storage capacitance C2 is connected with the pull-up control node PU_CN, and a second electrode of the second storage capacitance C2 is connected with the second voltage terminal VGL.

The first pull-down node reset circuit 141 can be implemented as a sixth transistor T6. A gate electrode of the sixth transistor T6 is connected with both the input circuit 110 and the pull-up node charging circuit 130, a first electrode of the sixth transistor T6 is connected with the pull-down node PD, and a second electrode of the sixth transistor T6 is connected with the second voltage terminal VGL.

The first pull-down node charging circuit 142 can be implemented to include a seventh transistor T7 and a third storage capacitance C3. A gate electrode and a first electrode of the seventh transistor 17 are configured to be connected with the second clock signal terminal CKB to receive the second clock signal, and a second electrode of the seventh transistor T7 is connected with the pull-down node PD. A first electrode of the third storage capacitance C3 is connected with the pull-down node PD, and a second electrode of the third storage capacitance C3 is connected with the second voltage terminal VGL.

The pull-up node reset circuit 150 can be implemented as an eighth transistor T8. A gate electrode of the eighth transistor T8 is connected with the pull-down node PD, a first electrode of the eighth transistor T8 is connected with the pull-up control node PU_CN, and a second electrode of the eighth transistor T8 is connected with the second voltage terminal VGL.

The output reset circuit 160 can be implemented as a ninth transistor T9. A gate electrode of the ninth transistor T9 is connected with the pull-down node PD, a first electrode of the ninth transistor T9 is connected with the output terminal OUT, and a second electrode of the ninth transistor T9 is connected with the second voltage terminal VGL.

The second pull-down node reset circuit 170 can be implemented as a tenth transistor T10. A gate electrode of the tenth transistor T10 is connected with the output terminal OUT, a first electrode of the tenth transistor T10 is connected with the pull-down node PD, and a second electrode of the tenth transistor T10 is connected with the second voltage terminal VGL.

The second pull-down node charging circuit 180 can be implemented as an eleventh transistor T1. A gate electrode and a first electrode of the eleventh transistor T1 are configured to be connected with the reset terminal Reset to receive the reset signal, and a second electrode of the eleventh transistor T1 is connected with the pull-down node PD.

The touch reset circuit 190 can be implemented as a twelfth transistor T12. A gate electrode of the twelfth transistor T12 is configured to be connected with the touch enable terminal EN_Touch to receive the touch enable signal, a first electrode of the twelfth transistor T12 is connected with the output terminal OUT, and a second electrode of the twelfth transistor T12 is connected with the second voltage terminal VGL.

It should be noted that the transistors in the embodiments of the present disclosure can adopt thin film transistors, field-effect transistors or other switching devices with the required characteristics. In the embodiments of the present disclosure, thin film transistors are adopted as an example for description. Source electrodes and drain electrodes of the transistors adopted herein can be symmetrical in structure, so the source electrodes and drain electrodes are not different structurally. In the embodiment of the present disclosure, in order to distinguish between the two electrodes of a transistor other than a gate electrode, it is directly described that one of the two electrodes is a first electrode and the other electrode is a second electrode.

In addition, the transistors in the embodiments of the present disclosure are all described by taking N-type transistors as examples. In this case, the first electrode can be a drain electrode and the second electrode can be a source electrode. It should be noted that, the embodiments of the present disclosure include, but are not limited to, the examples. For example, one or more switches in the pixel circuit provided in the embodiments of the present disclosure can also adopt P-type thin film transistors. In this case, the first electrode can be a source electrode and the second electrode can be a drain electrode. For a different type of transistor, each electrode of this transistors need to be correspondingly connected with reference to each electrode of the corresponding transistor employed in examples of the embodiments of the present disclosure.

For example, as shown in FIG. 5, the transistors of the shift register 100 all adopt N-type transistors. The first voltage terminal VGH maintains inputting the first voltage of a DC high level, and the second voltage terminal VGL maintains inputting the second voltage of a DC low level. The first clock signal terminal CK inputs the first clock signal, and the second clock signal terminal CKB inputs the second clock signal different from the first clock signal.

Figure 6:
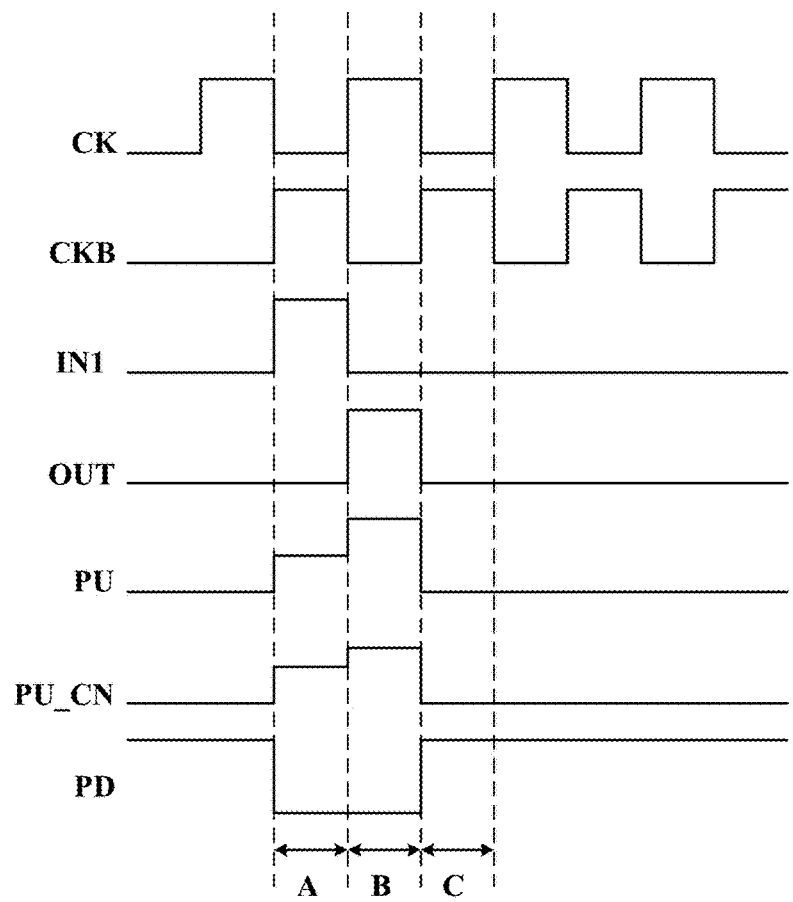
FIG. 6 is a signal timing diagram corresponding to the operation of the shift register as shown in FIG. 5.
Figure 8:
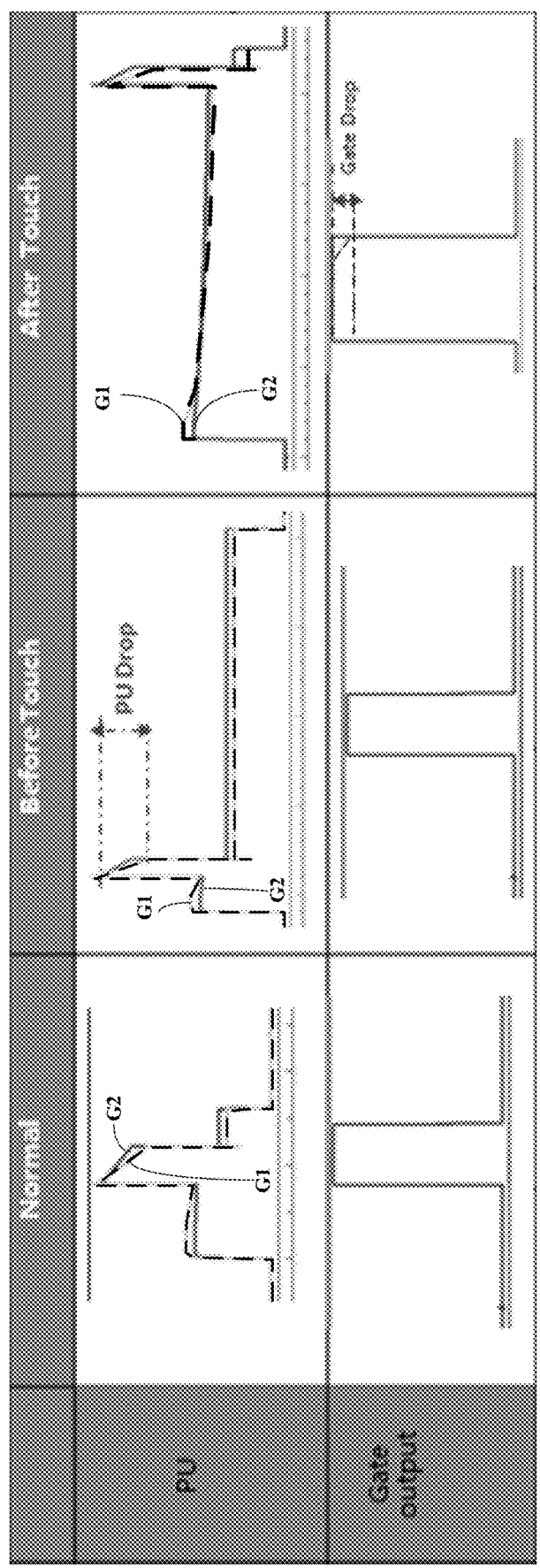
FIG. 8 is a simulation waveform comparison diagram of a gate driving circuit G1 formed by adopting a plurality of cascaded shift registers as shown in FIG. 1 and a gate driving circuit G2 formed by adopting a plurality of cascaded shift registers as shown in FIG. 5.

The following describes take the forward scanning mode as an example, that is, the first control terminal CN inputs the first control signal of a high level, the second control terminal CNB inputs the second control signal of a low level (the first transistor T1 remains in a turn-on state, and the second transistor T2 remains in a turn-off state), and the operation principle of the shift register 100 as shown in FIG. 5 will be described below in combination with a signal timing diagram as shown in FIG. 6. In a first stage A, a second stage B and a third stage C as shown in FIG. 8, the shift register 100 performs the following operations.

In the first stage A, the first input terminal IN1 inputs a high level, the first clock signal terminal CK inputs a low level, and the second clock signal terminal CKB inputs a high level. Because the first transistor T1 remains in a turn-on state, the first input signal of a high level inputted by the first input terminal IN1 can be transmitted to the pull-up node charging circuit 130 (that is, the gate electrode of the fourth transistor T4) through the first transistor T1. The fourth transistor T4 is turned on, a high level inputted by the first voltage terminal VGH can charge the second storage capacitance C2 through the fourth transistor T4, that is, the pull-up control node PU_CN is charged. At the same time, because the fifth transistor T5 remains in a turn-on state, the high level inputted by the first voltage terminal VGH can also charge the first storage capacitor C1 through the fifth transistor T5, that is, the pull-up node PU is charged, thereby the potential of the pull-up node PU is pulled up to a first high level. Because the pull-up node is at a high level, the third transistor is turned on, thereby outputting the low level inputted by the first clock signal terminal CK to the output terminal OUT.

It should be noted that in the first stage A, because the second clock signal terminal CKB inputs a high level, the seventh transistor T7 is turned on, thereby the second clock signal can charge the third storage capacitor C3, that is, the pull-down node PD is charged. At the same time, the sixth transistor T6 is turned on due to the first input signal of a high level, so the low level signal inputted by the second voltage terminal VGL pulls down the pull-down node PD. For example, in the design of the transistors, the sixth transistor T6 and the seventh transistor T7 can be configured (for example, aspect ratio, threshold voltages, etc. of these transistors) when the sixth transistor T6 and the seventh transistor T7 are both turned on, the level of the pull-down PD can maintain a low level without being pulled up.

In the second stage B, the first input terminal IN1 inputs a low level, the first clock signal terminal CK inputs a high level, and the second clock signal terminal CKB inputs a low level. Because the first transistor T1 remains in a turn-on state, the first input signal of a low level inputted by the first input terminal IN1 can be transmitted through the first transistor T1 to the gate electrode of the fourth transistor T4 and the gate electrode of the sixth transistor T6, thereby enabling the fourth transistor T4 and the sixth transistor T6 to be turned off. Because the second clock signal terminal CKB inputs a low level, the seventh transistor T7 is turned off, that is, the charging path of the pull-down node PD is turned off, and the pull-down node PD can maintain the low level of the preceding stage. The pull-up node PU maintains the high level, so the third transistor T3 continues to be turned on. Because the first clock signal terminal CK inputs the high level at this stage, the output terminal OUT outputs the high level signal. Due to the bootstrap effect of the first storage capacitor C1, the potential of the pull-up node PU is further pulled up to reach a second high level, so the third transistor T3 is turned on more sufficiently.

Because the output terminal OUT is at a high level, the tenth transistor T10 is turned on, and the pull-down node PD is electrically connected with the second voltage terminal VGL, thereby enabling the potential of the pull-down node PD to be further pulled down to prevent noises on the pull-down node PD from affecting the normal output of the output terminal OUT.

In the second stage B, the fourth transistor T4 is turned off, and at the same time, there is no voltage difference between the first electrode and the second electrode (that is, the source electrode and the drain electrode) of the second transistor 12, which can reduce the voltage drop of the pull-up node PU which is caused by the leakage current of the transistor, and enable the bootstrap voltage of the pull-up node PU to reach a higher level, thereby the normal output of the output terminal OUT can be guaranteed.

In the third stage C, the first input IN1 still inputs a low level, the first clock signal terminal CK inputs a low level, and the second clock signal terminal CKB inputs a high level. Same as the preceding stage, the fourth transistor T4 and the sixth transistor T6 remain in a turn-off state. Because the second clock signal terminal CKB inputs the high level, the seventh transistor T7 is turned on, the second clock signal of a high level can charge the third storage capacitor C3 through the seventh transistor T7, that is, the pull-down node PD is charged, and the potential of the pull-down node PD is pulled up to a high level.

Because the pull-down node PD is at a high level, the eighth transistor T8 is turned on, and the first storage capacitor C1 and the second storage capacitor C2 can both discharge through the eighth transistor T8, thereby pulling down and resetting the pull-up control node PU_CN and the pull-up node PU. Similarly, the ninth transistor T9 is also turned on, thereby pulling down and resetting the output terminal OUT.

For example, a plurality of cascaded shift registers 100 can be adopted to form a gate driving circuit. If the gate driving circuit is adopted to drive a display panel, a reset signal which is at high level can be provided to the shift registers 100 in the gate driving circuit at the same time when the display panel is powered on. The reset signal enables the eleventh transistor T11 to be turned on, thereby the reset signal of the high level can charge the pull-down node PD through the eleventh transistor T1 to pull up the potential of the pull-down node PD to a high level. As described above in the third stage C, when the pull-down node PD is at the high level, the eighth transistor T8 and the ninth transistor T9 are turned on, thereby the pull-up nodes PU and the output terminals OUT in the shift registers 100 of various stages can be reset simultaneously.

For example, when the gate driving circuit is used for a TDDI (Touch & Display Driver Integration) product, for example, the touch enable signal is generated to turn on the twelfth transistor T12, thereby resetting and denoising the output terminals OUT of the shift registers of various stages when the product enters a touch scanning stage, and so as to avoid the poor display.

Figure 7:
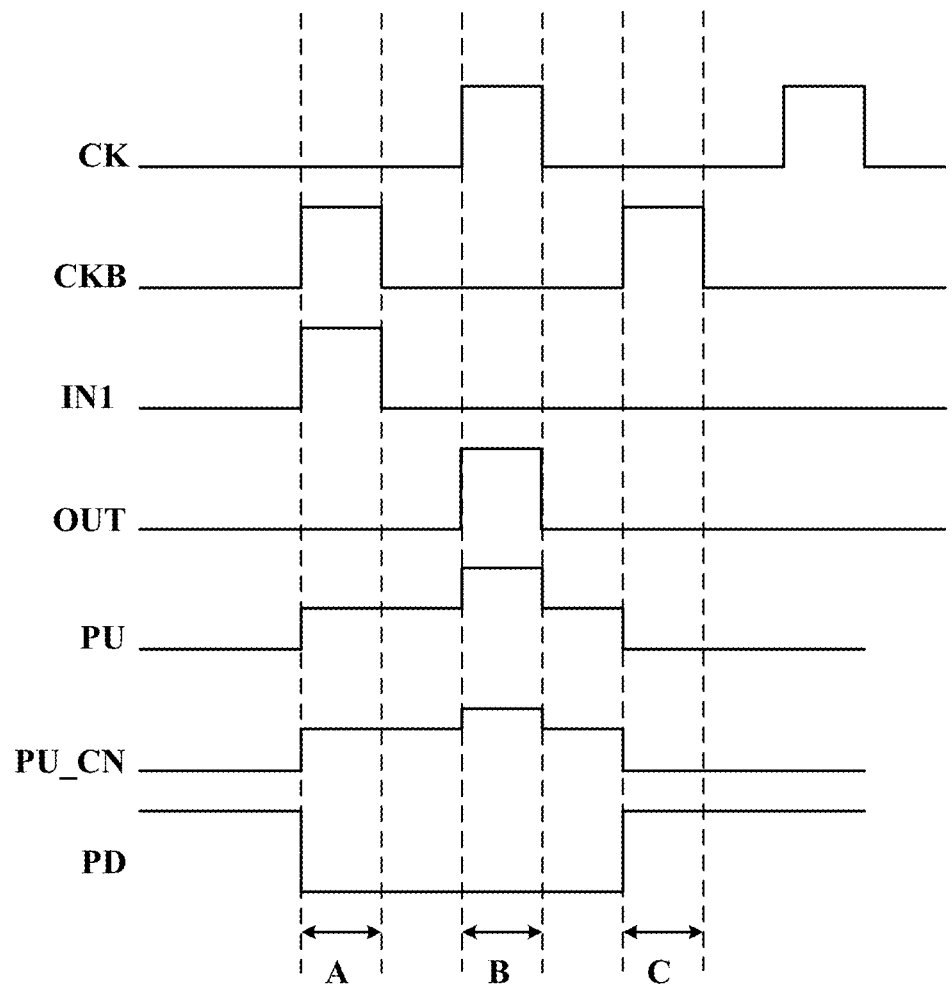
FIG. 7 is another signal timing diagram corresponding to the operation of the shift register as shown in FIG. 5.

It should be noted that, the timing signals of the first clock signal terminal CK and the second clock signal terminal CKB as shown in FIG. 6 are described by taking signals of 50% duty cycle as an example, and the embodiments of the present disclosure include but not limited to this, for example, timing signals of 25% duty cycle as shown in FIG. 7 can also be adopted. The other corresponding timing signals are shown in FIG. 7 and will not be repeated herein.

In summary, the shift register 100 provided by an embodiment of the present disclosure includes twelve transistors and three capacitors. Compared with the shift register (eleven transistors and three capacitors) as shown in FIG. 1, addition of the transistor T4 and change of the connection manner between the first transistor T1 and the second transistor T2 can better maintain the level of the pull-up node PU and reduce the voltage drop of the pull-up node PU, thereby enabling the output of the current stage to be kept normal and free from a voltage drop when the leakage current of the transistor is large under a high temperature condition. Furthermore, there is no output at other moments than the output of the current stage, that is, the problem of multiple outputs can be avoided. The shift register can solve the problem of poor display and the like, and in particular, can have a significant improvement effect in high-temperature reliability.

A plurality of cascaded shift registers as shown in FIG. 1 can be adopted to form a gate driving circuit, and the gate driving circuit is denoted as G1. Similarly, a plurality of cascaded shift registers as shown in FIG. 5 can be adopted to form a gate driving circuit, and the gate driving circuit is denoted as G2. The following embodiments are the same in this aspect and will not be repeated herein.

In a case of that the leakage current of the transistor is large under a high temperature condition, the simulation comparison results for G1 and G2 are shown in Table 1 and FIG. 8.

In connection with Table 1 and FIG. 8, it can be seen from the simulation waveforms of the two gate driving circuits that a bootstrap voltage of the pull-up node PU of the shift register in G1 is lower than a bootstrap voltage of the pull-up node PU of the shift register in G1. For shift registers in Normal (normal display state) and before the Touch (touch scanning) period, the bootstrap voltage drop of the pull-up node PU of the shift register as shown in FIG. 5 is smaller by 3V than the bootstrap voltage drop of the pull-up node PU of the shift register as shown in FIG. 1. For G1, in the shift register after the Touch period, the bootstrap voltage of the pull-up node PU drops to 6V, so the third transistor T3 cannot be turned on completely, and there is a voltage drop (1.5V) at an output terminal of the shift register after the Touch period. For G2, in the shift register after the Touch period, the bootstrap voltage of the pull-up node PU is smaller than that in G1, thereby enabling the output of current stage without a voltage drop.

TABLE 1

|  | Gate Driving Circuit | Normal | Before Touch | After Touch |
| --- | --- | --- | --- | --- |
| Bootstrap Voltage Drop of Pull-up Node PU | G1 | 7.8 V (19.2 V-11.4 V) | 7.9 V (19.2 V-11.3 V) | 9.4 V (15.4 V-6.0 V) |
|  | G2 | 4.8 V (18.6 V-13.8 V) | 4.8 V (18.6 V-13.8 V) | 5.0 V (16.5 V-11.5 V) |
| Holding Voltage Drop of Pull-up Node PU | G1 | 1.2 V (5.3 V-4.1 V) | −0.75 V | 3.7 V (5.2 V-1.5 V) |
|  | G2 | 0 V (3.8 V-3.8 V) | 0 V (0.23 V-0.23 V) | 2.0 V (3.85 V-1.85 V) |
| Gate Output | G1 | No voltage drop | No voltage drop | 1.5 V (8.0 V-6.5 V) |
|  | G2 | No voltage drop | No voltage drop | No voltage drop |

In the shift register which is in the Normal period and the shift register before the Touch period, for the holding voltage of the pull-up node PU after the charge of the pull-up node PU is finished, there is almost no voltage drop in the shift registers in G2 (in the case of a Normal period, the holding voltage remains substantially unchanged at 3.8V, and in the case of before a Touch period, the holding voltage remains substantially unchanged at 0.23V). The holding voltage of the pull-up node PU of the shift register in G1 has a voltage drop (0.2V) when the shift register is in the Normal period. For the shift register after the ouch period, the holding voltage drop of the pull-up node PU of the shift register in G2 is smaller by 1.7V than that in G1, that is, the voltage holding performance of the pull-up node PU of the shift register in G2 is better than that in G1, which is advantageous for the output of the shift register after the Touch period.

Specifically, for the shift registers in G1, because the first control terminal CN is at a high level and the second control terminal CNB is at a low level when G1 in the forward scanning, the pull-up node PU is charged and the voltage difference between the source electrode and the drain electrode of the second transistor T2 is large. The pull-up node PU can leak current through the second transistor T2, especially when the leakage current of the transistor is lager under a high temperature condition, there is a voltage drop at the pull-up node PU, which in turn causes a voltage drop at the output of the current stage. In addition, if the gate driving circuit G1 is used for a TDDI product, it can be seen from the "After Touch" simulation waveform as shown in FIG. 8 that the pull-up node PU has a large voltage drop after a touch scanning stage, and the bootstrap voltage of the pull-up node PU cannot reach a higher level when the current stage outputs a signal, thereby resulting in a voltage drop at the output of the current stage, and problems such as poor display may occur when the product displays again.

For the shift register in G2, it can be seen from simulation results in Table 1 and FIG. 8 that the bootstrap voltage of the pull-up node PU and the output are notably improved. For example, during the forward scanning, after the shift register of the preceding stage finishes charging the shift register of the current stage, the pull-up node PU is at a high level. The fourth transistor T4 is turned off when the shift register of the current stage outputs a signal, and there is no voltage difference between the source electrode and the drain electrode of the second transistor T2, which can reduce the voltage drop of the pull-up node PU caused by the leakage current of the transistor, and can enable the bootstrap voltage of the pull-up node PU of the shift register after the Touch period reaches a higher level, thereby the normal output of the output terminal OUT can be guaranteed.

In addition, by changing the connection manner between the first transistor T1 and the second transistor T2, the shift register provided by the embodiments of the present disclosure has no output at other moments than the output of the current stage, that is, the problem of multiple outputs can be avoided. The shift register that does not change the connection manner between the first transistor T1 and the second transistor T2 is shown in FIG. 9.

Figure 9:
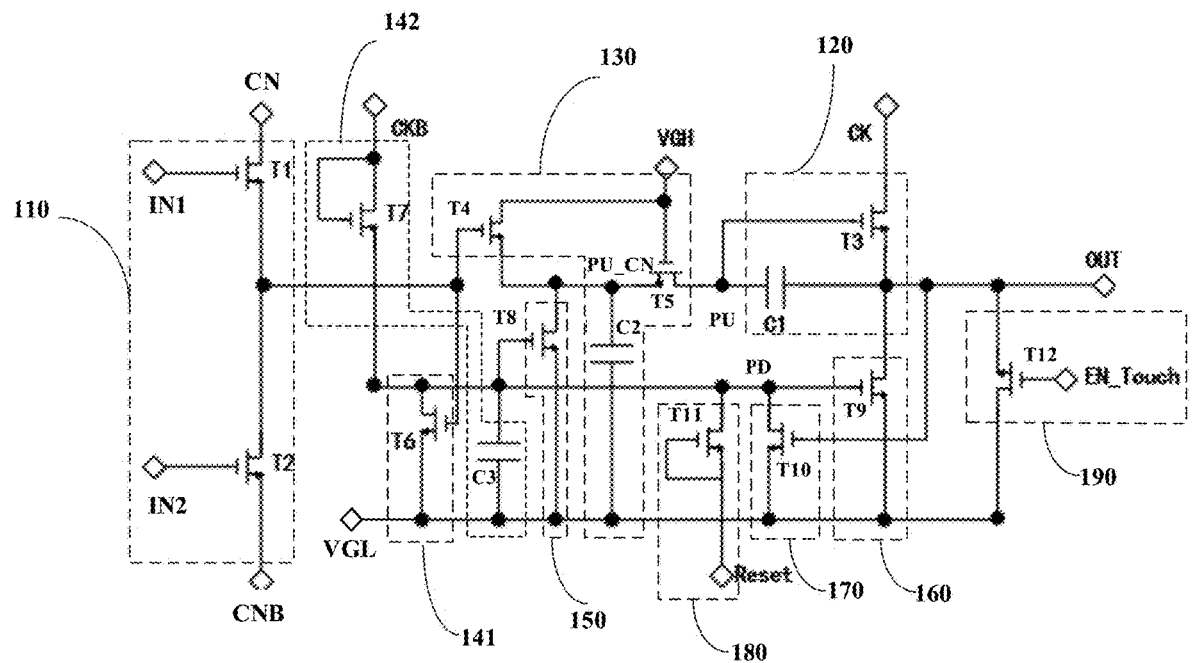
FIG. 9 is a schematic circuit diagram of a shift register according to another embodiment of the present disclosure.
Figure 10A:
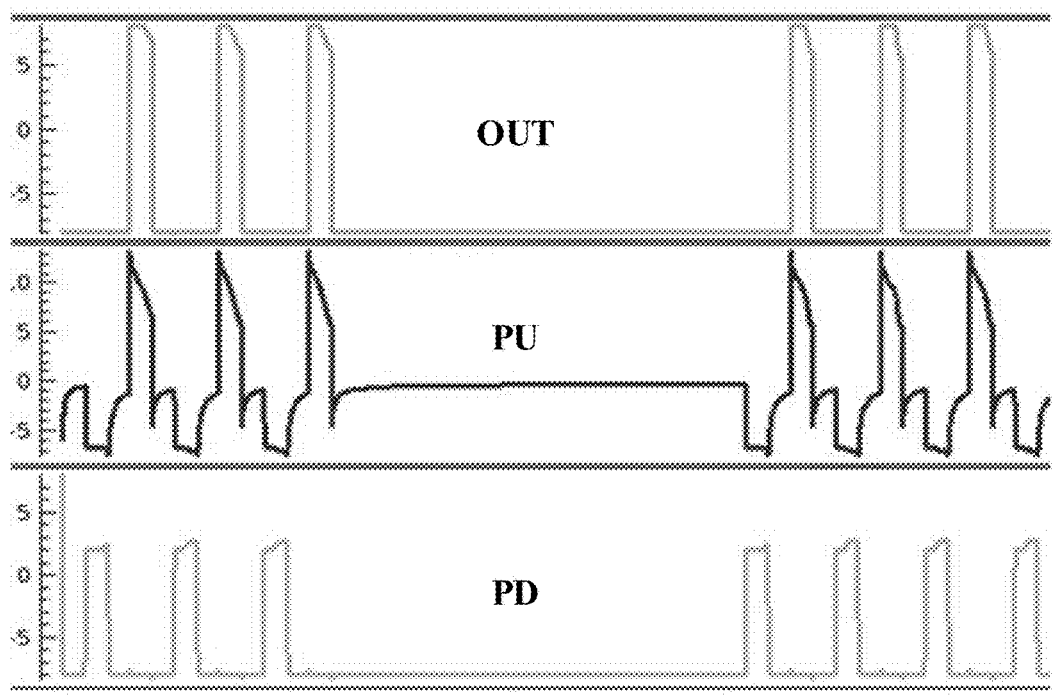
FIG. 10A is a schematic simulation waveform diagram of the shift register as shown in FIG. 9.
Figure 10B:
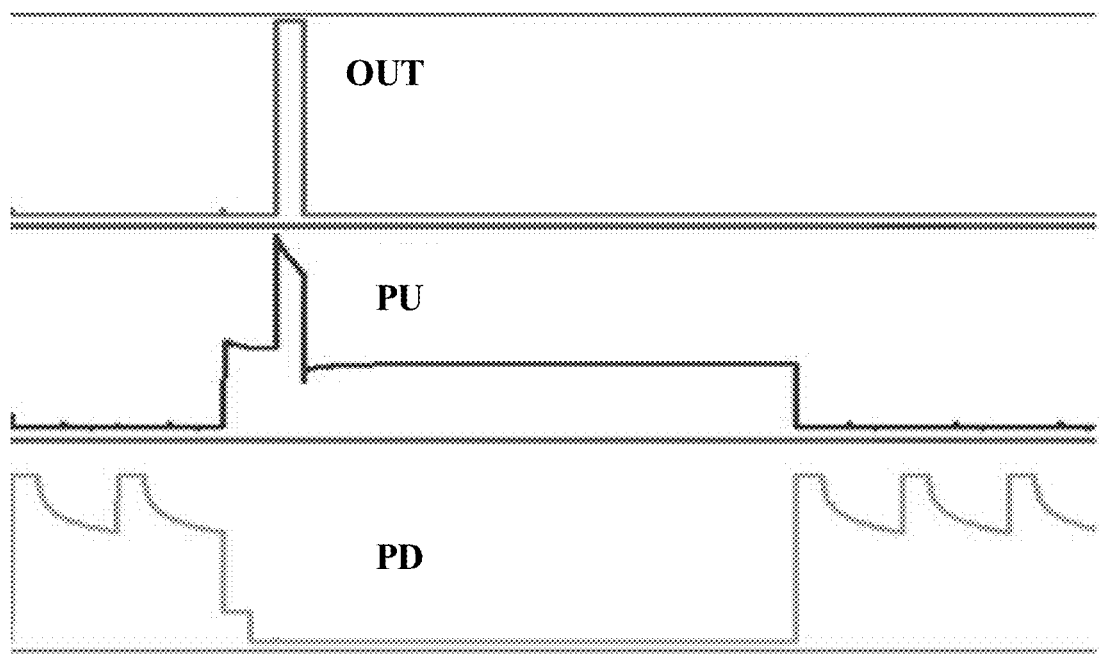
FIG. 10B is a schematic simulation waveform diagram of the shift register as shown in FIG. 5.

Specifically, by comparing the simulation waveform (as shown in FIG. 10A) of the shift register as shown in FIG. 9 and the simulation waveform (as shown in FIG. 10B) of the shift register as shown in FIG. 5, when the leakage current of the transistor of the shift register as shown in FIG. 9 is large under a high temperature condition, it can be seen from the simulation waveform as shown in FIG. 10A that the output terminal OUT has the problem of multiple outputs. For example, during the forward scanning mode, the first control terminal CN is at a high level. At other moments than the output of the current stage, because the turn-off current Ioff is relatively large due to the large voltage difference between the source electrode and the drain electrode of the first transistor T1, the fourth transistor T4 cannot be completely turned off, the high level signal inputted by the first voltage terminal VGH can charge the pull-up node PU through the fourth transistor T4 and the fifth transistor T5, and the potential of the pull-up node PU is pulled up, thereby the shift register of the current stage has the problem of multiple outputs.

It can be seen from the simulation waveform as shown in FIG. 10B, the shift register as shown in FIG. 5 does not have the problem of multiple outputs when the leakage current of the transistor is large under a high temperature condition. For example, during the forward scanning, at other moments than the output of the current stage, there is no voltage difference between the source electrode and the drain electrode of the first transistor T1, and the turn-off current Ioff of the first transistor T1 is small, so the fourth transistor T4 can be completely turned off. At other moments, the potential of the pull-up node PU does not increase, so the shift register of the current stage does not have the problem of multiple outputs.

In the shift register provided by any of the embodiments of the present disclosure, addition of a transistor (the fourth transistor T4) and change of the connection manner between the first transistor T1 and the second transistor T2 can better maintain the level of the pull-up node PU and reduce the voltage drop of the pull-up node PU, thereby enabling the output of the current stage to be kept normal and free from a voltage drop when the leakage current of the transistor is large under a high temperature condition. Furthermore, there is no output at other moments than the output of the current stage, that is, a problem of multiple outputs can be avoided. The shift register can solve the problem of poor display and the like, and in particular, it has a significant improvement effect in high-temperature reliability.

Figure 11:
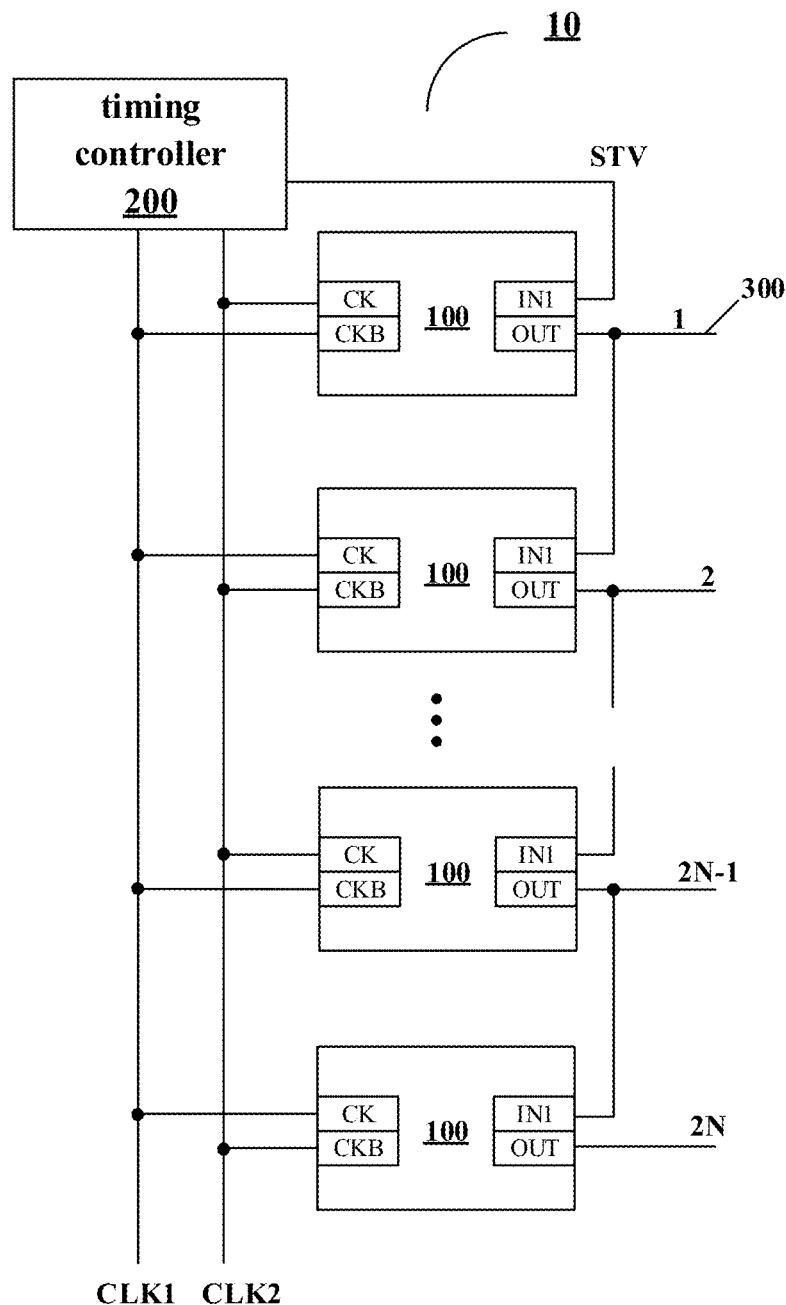
FIG. 11 is a schematic diagram of a gate driving circuit according to an embodiment of the present disclosure.
Figure 12:
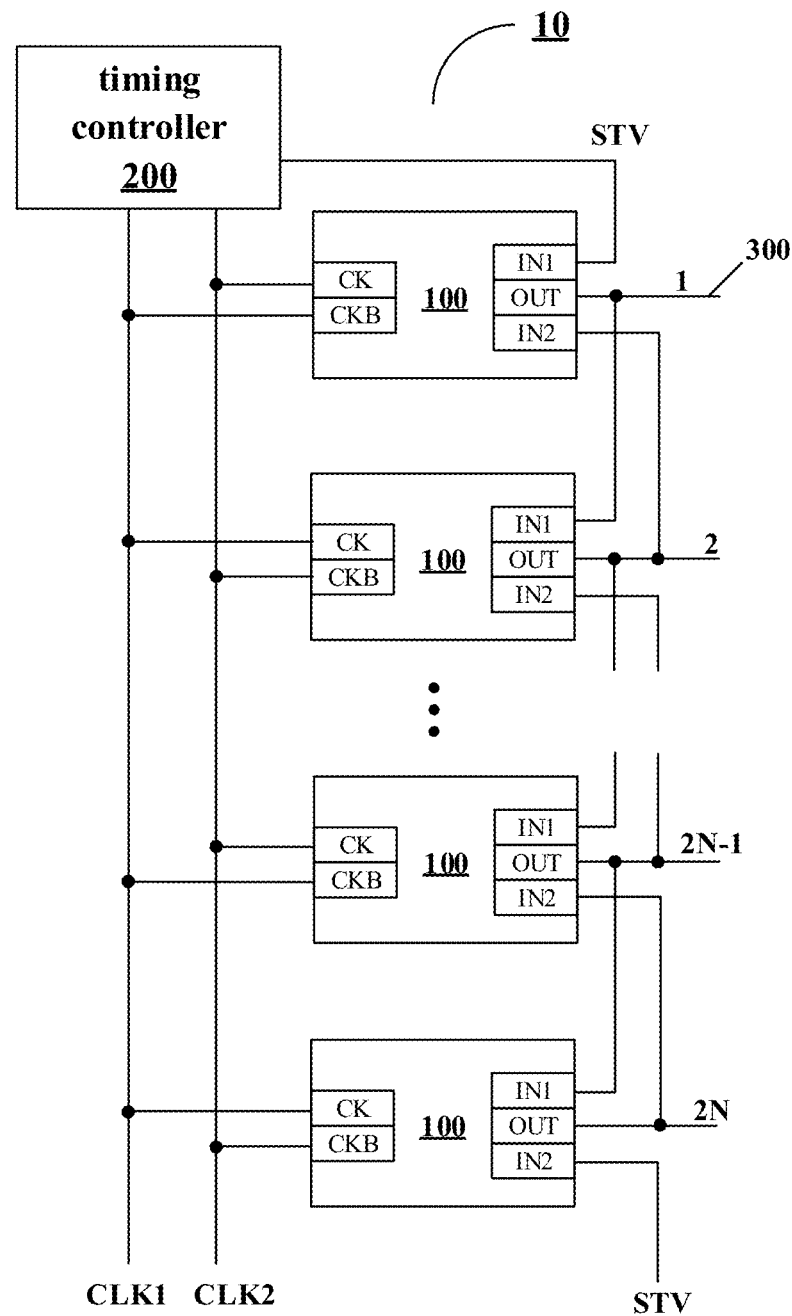
FIG. 12 is a schematic diagram of another gate driving circuit according to an embodiment of the present disclosure.
Figure 13:
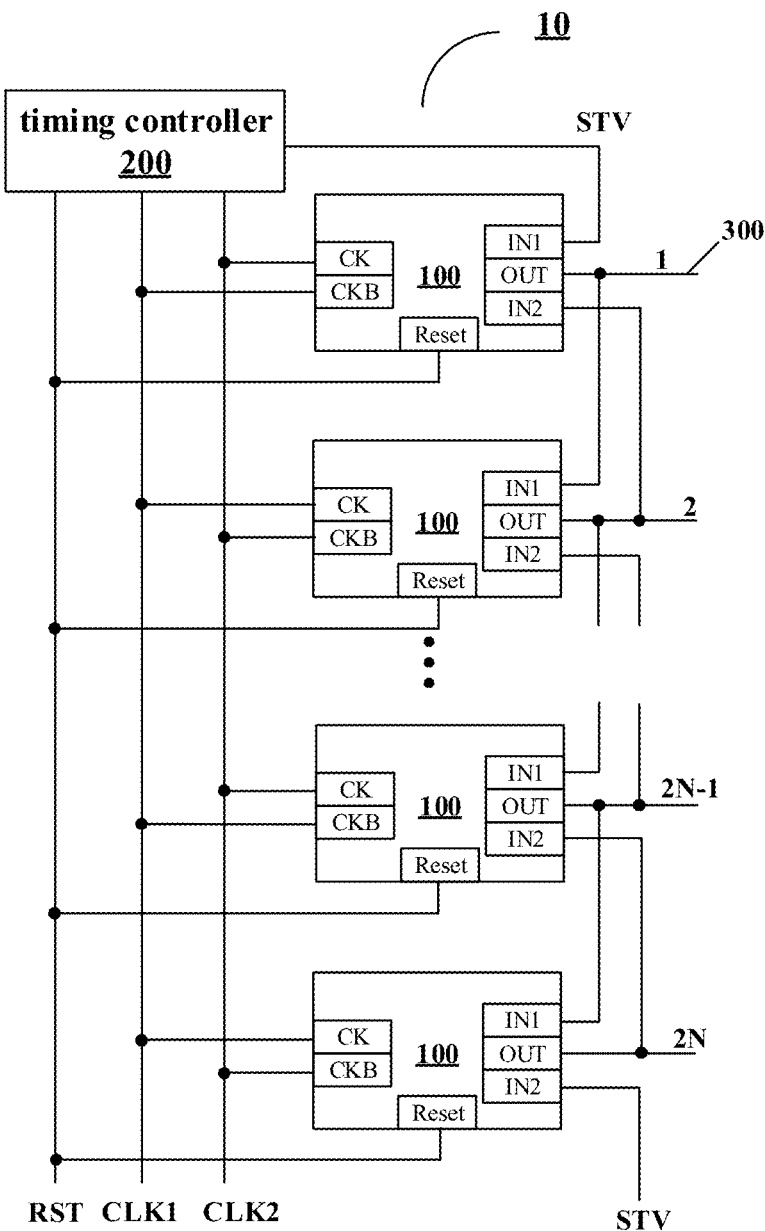
FIG. 13 is a schematic diagram of still another gate driving circuit according to an embodiment of the present disclosure.

At least one embodiment of the present disclosure provides a gate driving circuit 10, as shown in FIG. 11, FIG. 12 and FIG. 13, the gate driving circuit 10 includes a plurality of cascaded shift register 100, and the shift register 100 each can adopt the shift register which is provided in any of the above-described embodiments. The gate driving circuit 10 can be directly fabricated on an array substrate of a display apparatus by adopting the processes similar to those for forming a thin film transistor, and can realize the function of performing display line by line.

For example, as shown in FIG. 11, in a case of that the shift register 100 does not include the second input terminal IN2 and the second control terminal CNB, except the first-stage shift register, the first input terminal IN1 of each of the shift register of the other stages is connected with the output terminal OUT of the shift register of the preceding stage. For example, the first input terminal IN1 of the first-stage shift register can be configured to receive a trigger signal STV. The gate driving circuit as shown in FIG. 11 cannot implement the bidirectional scanning.

For example, as shown in FIG. 12, in a case of that the shift register 100 includes the second input terminal IN2 and the second control terminal CNB, except the first-stage shift register, the first input terminals IN1 of each of the shift register of the other stages is connected with the output terminal OUT of the shift register of the preceding stage, and except the last-stage shift register, the second input terminal IN2 of each of the shift registers of the other stages is connected with the output terminal OUT of the shift register of the next stage. For example, the first input terminal IN1 of the first-stage shift register and the second input terminal IN2 of the last-stage shift register can be configured to receive a trigger signal STV, respectively. The gate driving circuit as shown in FIG. 12 can implement the bidirectional scanning.

For example, as shown in FIG. 13, in a case of that the shift register 100 includes a reset terminal Reset, for example, the reset terminals Reset of the shift registers 100 can be connected with the timing controller 200 to receive the reset signal RST. For example, the gate driving circuit 10 as shown in FIG. 13 is adopted to drive a display panel, the reset signal RST can be provided to the shift registers in the gate driving circuit at the same time when the display panel is powered on, so as to implement an initialization of the entire gate driving circuit.

For example, as shown in FIG. 11, FIG. 12 and FIG. 13, if the gate driving circuit 10 is adopted to drive a display panel, the gate driving circuit 10 can be disposed on one side of the display panel in an example. For example, the display panel includes 2N rows of gate lines 300 (N is an integer greater than zero), and the output terminals OUT of the shift registers 100 in the gate drive circuit 10 can be configured to connect with the 2N rows of gate lines 300 in sequence (as indicated by the reference numbers 1, 2, . . . , 2N−1, 2N in FIG. 11 and FIG. 12, N is an integer greater than zero) for outputting progressive scanning signals.

For example, as shown in FIG. 11, FIG. 12 and FIG. 13, the clock signals can be provided to the clock signal terminals (the first clock signal terminal CK and the second clock signal terminal CKB) in each shift register 100 through two system clock signals CLK1 and CLK2. For example, the first clock signal terminal CK of the first-stage shift register 100 inputs CLK2, and the second clock signal terminal CKB inputs CLK1; the first clock signal terminal CK of the second-stage shift register 100 inputs CLK1, and the second clock signal terminal CKB inputs CLK2. In the same way, the first clock signal terminal CK of the (2N−1)th-stage shift register 100 inputs CLK2, and the second clock signal terminal CKB inputs CLK1; the first clock signal terminal CK of the (2N)th-stage shift register 100 inputs CLK1, and the second clock signal terminal CKB inputs CLK2. For example, in this configuration, CLK1 and CLK2 can adopt timing signals of 50% duty cycle.

It should be noted that, when the gate driving circuit 10 as shown in FIG. 11, FIG. 12 or FIG. 13 are adopted to drive a display panel, the gate driving circuit 10 can also be symmetrically disposed on both sides of the display panel. The output terminals OUT of the gate driving circuits 10 are connected with both ends of the corresponding gate lines, thereby implementing a bilateral driving manner. For example, the bilateral driving manner can be applied to drive large and medium sized display panels to solve the problem of large load on the gate lines.

In addition, if the gate driving circuit 10 as shown in FIG. 11, FIG. 12 or FIG. 13 are adopted to drive a display panel, one gate driving circuit 10 can also be disposed on one side of the display panel for driving gate lines of odd rows, while another gate driving circuit 10 is disposed on the other side of the display panel for driving gate lines of even rows. For example, in this configuration, CLK1 and CLK2 can adopt timing signals of 25% duty cycle.

For example, as shown in FIG. 11, FIG. 12 and FIG. 13, the gate driving circuit 10 further includes a timing controller 200. For example, the timing controller 200 is configured to provide clock signals (CLK1, CLK2) to shift register 100, and the timing controller 200 also be configured to provide the trigger signal STV, the reset signal RST and the touch enable signal.

The technical effects of the gate driving circuit 10 provided in the embodiments of the present disclosure can refer to the corresponding descriptions of the shift registers 100 in the embodiments of the present disclosure, and details are not described here again.

Figure 14:
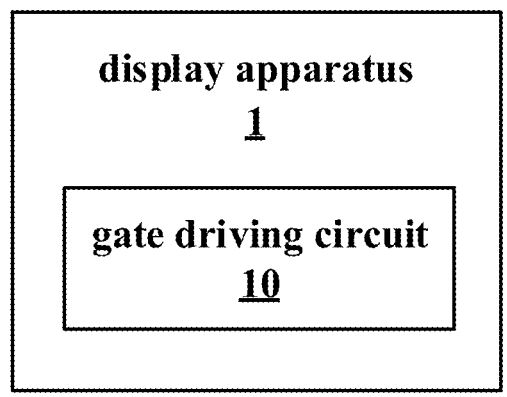
FIG. 14 is a schematic block diagram of a display-apparatus according to an embodiment of the present disclosure.

At least one embodiment of the present disclosure further provides a display apparatus 1, as shown in FIG. 14, the display apparatus 1 includes the gate driving circuit 10 provided by any of the above-described embodiments.

It should be noted that the display apparatus 1 in this embodiment can be a liquid crystal panel, a liquid crystal television, a display, an OLED panel, an OLED television, an electronic paper, a mobile phone, a tablet computer, a notebook computer, a digital photo frame, a navigator and other products or members having display function. The display apparatus 1 further includes other conventional members, such as a display panel, which are not limited by the embodiments of the present disclosure.

The technical effects of the display apparatus 1 provided in the embodiments of the present disclosure can refer to the corresponding descriptions of the shift register 100 in the embodiments of the present disclosure, and details are not described herein again.

At least one embodiment of the present disclosure further provides a driving method, and the driving method can be adopted to drive any one of the shift registers 100 provided in the embodiments of the present disclosure. For example, the driving method includes the following operations.

In a first stage, the input circuit 110 outputs the first input signal in response to the first control signal, the pull-up node charging circuit 130 charges the pull-up node PU under the control of the first input signal, and the first pull-down node reset circuit 141 pulls down and resets the pull-down node PD in response to the first input signal.

In a second stage, the pull-up node charging circuit 130 maintains the level of the pull-up node PU, and the output circuit 120 outputs the first clock signal to the output terminal OUT under the control of the level of the pull-up node PU.

In a third stage, the first pull-down node charging circuit 142 charges the pull-down node PD in response to the second clock signal, the pull-up node reset circuit 150 pulls down and resets the pull-up node PU under the control of the level of the pull-down node PD, and the output reset circuit 160 resets and denoises the output terminal OUT under the control of the level of the pull-down node PD.

In the first stage, the second stage and the third stage described above, one of the first clock signal and the second clock signal is a high level signal, and the other is a low level signal.

It should be noted that, for the detailed description and technical effects of the above-described driving method, reference can be made to the description of the operation principle of the shift register 100 in the related embodiments of the present disclosure, and details are not described here again.

At least one embodiment of the present disclosure further provides a driving method, and the driving method can be adopted to drive the shift register 100 including the second input terminal IN2 and the second control terminal CNB in an embodiment of the present disclosure. For example, the driving method includes the following operations.

When the first control signal is at a first level and the second control signal is at a second level, the shift register operates in a forward scanning mode.

When the first control signal is at the second level and the second control signal is at the first level, the shift register operates in a reverse scanning mode.

One of the first level and the second level is a high level and the other is a low level.

It should be noted that, for the detailed description and technical effects of the above-described driving method, reference can be made to the description of the operation principle of the shift register 100 in the related embodiments of the present disclosure, and details are not described here again.

What have been described above are only specific implementations of the present disclosure, the protection scope of the present disclosure is not limited thereto. The protection scope of the present disclosure should be based on the protection scope of the claims.

What is claimed is:

1. A shift register, comprising: an input circuit, a pull-up node charging circuit, an output circuit, a pull-down node control circuit, an output reset circuit and a pull-up node reset circuit, wherein the input circuit is connected with a first input terminal, a first control terminal and the pull-up node charging circuit, and is configured to output a first input signal provided by the first input terminal in response to a first control signal provided by the first control terminal;

the pull-up node charging circuit is connected with a first voltage terminal, a second voltage terminal, the input circuit and a pull-up node, and is configured to charge the pull-up node and maintain a level of the pull-up node under control of the first input signal;

the output circuit is connected with the pull-up node, a first clock signal terminal and an output terminal, and is configured to output a first clock signal provided by the first clock signal terminal to the output terminal under control of the level of the pull-up node;

the pull-down node control circuit is connected with a second clock signal terminal, the second voltage terminal, a pull-down node, the input circuit and the pull-up node charging circuit, and is configured to control a level of the pull-down node in response to a second clock signal provided by the second clock signal terminal or in response to the first input signal;

the pull-up node reset circuit is connected with the pull-down node, the second voltage terminal and the pull-up node charging circuit, and is configured to pull down and reset the pull-up node under control of the level of the pull-down node; and the output reset circuit is connected with the output terminal, the pull-down node and the second voltage terminal, and is configured to reset and denoise the output terminal under control of the level of the pull-down node.

2. The shift register according to claim 1, wherein the pull-down node control circuit comprises a first pull-down node charging circuit and a first pull-down node reset circuit, the first pull-down node charging circuit is connected with the second clock signal terminal, the second voltage terminal and the pull-down node, and is configured to charge the pull-down node in response to the second clock signal provided by the second clock signal terminal; and the first pull-down node reset circuit is connected with the second voltage terminal, the pull-down node, the input circuit and the pull-up node charging circuit, and is configured to pull down and reset the pull-down node in response to the first input signal.

3. The shift register according to claim 1, further comprising a second pull-down node reset circuit, wherein the second pull-down node reset circuit is connected with the pull-down node, the output terminal and the second voltage terminal, and is configured to pull down and reset the pull-down node under control of a level of the output terminal.

4. The shift register according to claim 1, further comprising a second pull-down node charging circuit, wherein the second pull-down node charging circuit is connected with the pull-down node and a reset terminal, and is configured to charge the pull-down node in response to a reset signal provided by the reset terminal.

5. The shift register according to claim 1, further comprising a touch reset circuit, wherein the touch reset circuit is connected with the output terminal, the second voltage terminal and a touch enable terminal, and is configured to reset and denoise the output terminal in response to a touch enable signal provided by the touch enable terminal.

6. The shift register according to claim 1, wherein the input circuit comprises a first transistor;

a gate electrode of the first transistor is configured to be connected with the first control terminal to receive the first control signal, a first electrode of the first transistor is configured to be connected with the first input terminal to receive the first input signal, and a second electrode of the first transistor is connected with the pull-up node charging circuit.

7. The shift register according to claim 6, wherein the input circuit further comprises a second transistor;

a gate electrode of the second transistor is configured to be connected with a second control terminal to receive a second control signal, a first electrode of the second transistor is connected with the pull-up node charging circuit, and a second electrode of the second transistor is configured to be connected with a second input terminal to receive a second input signal;

wherein the first transistor and the second transistor are not turned on simultaneously.

8. The shift register according to claim 1, wherein the output circuit comprises a third transistor and a first storage capacitance;

a gate electrode of the third transistor is connected with the pull-up node, a first electrode of the third transistor is configured to be connected with the first clock signal terminal to receive the first clock signal, and a second electrode of the third transistor is connected with the output terminal; and a first electrode of the first storage capacitance is connected with the pull-up node, and a second electrode of the first storage capacitance is connected with the output terminal.

9. The shift register according to claim 1, wherein the pull-up node charging circuit comprises a fourth transistor, a fifth transistor and a second storage capacitance;

a gate electrode of the fourth transistor is connected with the input circuit, a first electrode of the fourth transistor is connected with a first voltage terminal, and a second electrode of the fourth transistor is connected with a pull-up control node;

a gate electrode of the fifth transistor is connected with the first voltage terminal, a first electrode of the fifth transistor is connected with the pull-up control node, and a second electrode of the fifth transistor is connected with the pull-up node; and a first electrode of the second storage capacitance is connected with the pull-up control node, and a second electrode of the second storage capacitance is connected with the second voltage terminal.

10. The shift register according to claim 2, wherein the first pull-down node reset circuit comprises a sixth transistor;

a gate electrode of the sixth transistor is connected with both the input circuit and the pull-up node charging circuit, a first electrode of the sixth transistor is connected with the pull-down node, and a second electrode of the sixth transistor is connected with the second voltage terminal.

11. The shift register according to claim 2, wherein the first pull-down node charging circuit comprises a seventh transistor and a third storage capacitance;

a gate electrode and a first electrode of the seventh transistor are configured to be connected with the second clock signal terminal to receive the second clock signal, and a second electrode of the seventh transistor is connected with the pull-down node; and a first electrode of the third storage capacitance is connected with the pull-down node, and a second electrode of the third storage capacitance is connected with the second voltage terminal.

12. The shift register according to claim 4, wherein the second pull-down node circuit charging comprises an eleventh transistor;
  a gate electrode and a first electrode of the eleventh transistor are configured to be connected with the reset terminal to receive the reset signal, and a second electrode of the eleventh transistor is connected with the pull-down node.

13. The shift register according to claim 5, wherein the touch reset circuit comprises a twelfth transistor;
  a gate electrode of the twelfth transistor is configured to be connected with the touch enable terminal to receive the touch enable signal, a first electrode of the twelfth transistor is connected with the output terminal, and a second electrode of the twelfth transistor is connected with the second voltage terminal.

14. A gate driving circuit, comprising a plurality of cascaded shift registers each of which comprises:
  an input circuit, a pull-up node charging circuit, an output circuit, a pull-down node control circuit, an output reset circuit and a pull-up node reset circuit,
  wherein the input circuit is connected with a first input terminal, a first control terminal and the pull-up node charging circuit, and is configured to output a first input signal provided by the first input terminal in response to a first control signal provided by the first control terminal;
  the pull-up node charging circuit is connected with a first voltage terminal, a second voltage terminal, the input circuit and a pull-up node, and is configured to charge the pull-up node and maintain a level of the pull-up node under control of the first input signal;
  the output circuit is connected with the pull-up node, a first clock signal terminal and an output terminal, and is configured to output a first clock signal provided by the first clock signal terminal to the output terminal under control of the level of the pull-up node;
  the pull-down node control circuit is connected with a second clock signal terminal, the second voltage terminal, a pull-down node, the input circuit and the pull-up node charging circuit, and is configured to control a level of the pull-down node in response to a second clock signal provided by the second clock signal terminal or in response to the first input signal;
  the pull-up node reset circuit is connected with the pull-down node, the second voltage terminal and the pull-up node charging circuit, and is configured to pull down and reset the pull-up node under control of the level of the pull-down node; and
  the output reset circuit is connected with the output terminal, the pull-down node and the second voltage terminal, and is configured to reset and denoise the output terminal under control of the level of the pull-down node;
  wherein except a first-stage shift register, a first input terminal of each stage shift register in the shift registers of other stages is connected with an output terminal of a shift register of a preceding stage.

15. The gate driving circuit, according to claim 14, wherein the input circuit comprises a first transistor;
  a gate electrode of the first transistor is configured to be connected with the first control terminal to receive the first control signal, a first electrode of the first transistor is configured to be connected with the first input terminal to receive the first input signal, and a second electrode of the first transistor is connected with the pull-up node charging circuit;
  the input circuit further comprises a second transistor;
  a gate electrode of the second transistor is configured to be connected with a second control terminal to receive a second control signal, a first electrode of the second transistor is connected with the pull-up node charging circuit, and a second electrode of the second transistor is configured to be connected with a second input terminal to receive a second input signal;
  wherein the first transistor and the second transistor are not turned on simultaneously;
  wherein
  except a last-stage shift register, a second input terminal of each stage shift register in the shift registers of other stages is connected with an output terminal of a shift register of a next stage.

16. A driving method of a shift register wherein the shift register comprises:
  an input circuit, a pull-up node charging circuit, an output circuit, a pull-down node control circuit, an output reset circuit and a pull-up node reset circuit,
  wherein the input circuit is connected with a first input terminal, a first control terminal and the pull-up node charging circuit, and is configured to output a first input signal provided by the first input terminal in response to a first control signal provided by the first control terminal;
  the pull-up node charging circuit is connected with a first voltage terminal, a second voltage terminal, the input circuit and a pull-up node, and is configured to charge the pull-up node and maintain a level of the pull-up node under control of the first input signal;
  the output circuit is connected with the pull-up node, a first clock signal terminal and an output terminal, and is configured to output a first clock signal provided by the first clock signal terminal to the output terminal under control of the level of the pull-up node;
  the pull-down node control circuit is connected with a second clock signal terminal, the second voltage terminal, a pull-down node, the input circuit and the pull-up node charging circuit, and is configured to control a level of the pull-down node in response to a second clock signal provided by the second clock signal terminal or in response to the first input signal;
  the pull-up node reset circuit is connected with the pull-down node, the second voltage terminal and the pull-up node charging circuit, and is configured to pull down and reset the pull-up node under control of the level of the pull-down node; and
  the output reset circuit is connected with the output terminal, the pull-down node and the second voltage terminal, and is configured to reset and denoise the output terminal under control of the level of the pull-down node;
  the driving method comprises:
  in a first stage, by the input circuit, outputting the first input signal in response to the first control signal, and by the pull-up node charging circuit, charging the pull-up node under control of the first input signal; and
  in a second stage, by the pull-up node charging circuit, maintaining the level of the pull-up node, and by the output circuit, outputting the first clock signal to the output terminal under control of the level of the pull-up node.

17. The driving method according to claim 16, wherein the pull-down node control circuit comprises a first pull-down node charging circuit and a first pull-down node reset circuit, the first pull-down node charging circuit is connected with the second clock signal terminal, the second voltage terminal and the pull-down node, and is configured to charge the pull-down node in response to the second clock signal provided by the second clock signal terminal; and the first pull-down node reset circuit is connected with the second voltage terminal, the pull-down node, the input circuit and the pull-up node charging circuit, and is configured to pull down and reset the pull-down node in response to the first input signal;

the driving method further comprising:

in the first stage, by the first pull-down node reset circuit, pulling down and resetting the pull-down node in response to the first input signal; and in a third stage, by the first pull-down node charging circuit, charging the pull-down node in response to the second clock signal, by the pull-up node reset circuit, pulling down and resetting the pull-up node under control of the level of the pull-down node, and by the output reset circuit, resetting and denoising the output terminal under control of the level of the pull-down node, wherein in the first stage, the second stage and the third stage, one of the first clock signal and the second clock signal is a high level signal, and the other is a low level signal.

18. The driving method according to claim 16, wherein the input circuit comprises a first transistor;

a gate electrode of the first transistor is configured to be connected with the first control terminal to receive the first control signal, first electrode of the first transistor is configured to be connected with the first input terminal to receive the first input signal, and a second electrode of the first transistor is connected with the pull-up node charging circuit;

the input circuit further comprises a second transistor, a gate electrode of the second transistor is configured to be connected with a second control terminal to receive a second control signal, a first electrode of the second transistor is connected with the pull-up node charging circuit, and a second electrode of the second transistor is configured to be connected with a second input terminal to receive a second input signal;

wherein the first transistor and the second transistor are not turned on simultaneously;

the driving method further comprises:

when the first control signal is at a first level and the second control signal is at a second level, enabling the shift register to operate in a forward scanning mode; and when the first control signal is at the second level and the second control signal is at the first level, enabling the shift register to operate in a reverse scanning mode, wherein one of the first level and the second level is a high level and the other is a low level.

* * * * *